(12) United States Patent
Hage et al.

(10) Patent No.: US 10,267,061 B2
(45) Date of Patent: Apr. 23, 2019

(54) LOCKING SYSTEM AND METHOD FOR A MOVABLE FREIGHT CONTAINER

(71) Applicants: Joseph Hage, La Canada, CA (US); Pierre Touma, Austin, TX (US); Elias Bachaalany, Halat (LB); Imad Maalouf, El Metn (LB)

(72) Inventors: Joseph Hage, La Canada, CA (US); Pierre Touma, Austin, TX (US); Elias Bachaalany, Halat (LB); Imad Maalouf, El Metn (LB)

(*) Notice: Subject to any disclaimer, the term of this patent is extended or adjusted under 35 U.S.C. 154(b) by 0 days.

(21) Appl. No.: 15/942,559

(22) Filed: Apr. 1, 2018

(65) Prior Publication Data
US 2018/0283048 A1 Oct. 4, 2018

Related U.S. Application Data

(60) Provisional application No. 62/480,963, filed on Apr. 3, 2017.

(51) Int. Cl.
| E05B 45/08 | (2006.01) |
| E05B 17/22 | (2006.01) |
| G01D 5/14 | (2006.01) |
| E05B 39/00 | (2006.01) |
| G01S 19/13 | (2010.01) |
| G01S 19/47 | (2010.01) |

(Continued)

(52) U.S. Cl.
CPC .............. *E05B 45/08* (2013.01); *E05B 17/22* (2013.01); *E05B 39/005* (2013.01); *G01D 5/145* (2013.01); *G01D 5/16* (2013.01); *G01D 21/02* (2013.01); *G01L 5/0052* (2013.01); *G01P 15/18* (2013.01); *G01R 33/0206* (2013.01); *G01S 19/13* (2013.01); *G01S 19/47* (2013.01);

(Continued)

(58) Field of Classification Search
CPC ...... E05B 45/08; E05B 17/22; E05B 27/0003; E05B 39/005; E05B 2045/0665; G01D 5/145
USPC ......................................... 340/542
See application file for complete search history.

(56) References Cited

U.S. PATENT DOCUMENTS

| 3,751,086 A * | 8/1973 | Geringer | ............... E05B 47/026 251/65 |
| 5,493,279 A * | 2/1996 | Dawson | .................. E05B 39/00 340/5.32 |

(Continued)

OTHER PUBLICATIONS

Web page from Mul-T-Lock Website. Source: https://www.mul-t-lock.com/en/site/mul-t-lock/products/padlocks/c-series-padlocks/c-series-padlock-single-pin-/. Downloaded on Apr. 1, 2018.

(Continued)

*Primary Examiner* — John A Tweel, Jr.

(57) ABSTRACT

A locking system and method for a movable freight container comprises an electronic module with a shaft that goes into a cavity in a mechanical lock module. The shaft is securely retained in the cavity by a lock mechanism in the mechanical lock module by moving the lock mechanism to a locked position. A plurality of magnetic field sensors in the shaft are used to read the position of the shaft in the cavity by sensing or not sensing one or more magnets in the lock mechanism to confirm continuous time insertion of the shaft in the cavity. A wireless communication component in the electronic module wirelessly transmits an alarm signal if the magnetic field sensors detect an unexpected interruption in at least one of the continuous time shaft position magnetic sensor readings.

20 Claims, 20 Drawing Sheets

(51) Int. Cl.

| | | |
|---|---|---|
| *G01D 5/16* | (2006.01) | |
| *G01R 33/02* | (2006.01) | |
| *G01P 15/18* | (2013.01) | |
| *G01L 5/00* | (2006.01) | |
| *G01D 21/02* | (2006.01) | |
| *G06Q 10/08* | (2012.01) | |
| *G08B 21/18* | (2006.01) | |
| *E05B 27/00* | (2006.01) | |
| *E05B 45/06* | (2006.01) | |
| *H04W 84/04* | (2009.01) | |
| *H04W 84/18* | (2009.01) | |
| *G01P 15/08* | (2006.01) | |
| *G08B 29/04* | (2006.01) | |

(52) U.S. Cl.
CPC ........ *G06Q 10/083* (2013.01); *E05B 27/0003* (2013.01); *E05B 2045/0665* (2013.01); *G01P 15/0891* (2013.01); *G08B 21/18* (2013.01); *G08B 29/046* (2013.01); *H04W 84/042* (2013.01); *H04W 84/18* (2013.01)

(56) References Cited

U.S. PATENT DOCUMENTS

| | | |
|---|---|---|
| 6,747,558 B1 | 6/2004 | Thorne et al. |
| 6,753,775 B2 | 6/2004 | Auerbach et al. |
| 7,411,495 B2 | 8/2008 | Auerbach et al. |
| 7,916,016 B2 | 3/2011 | Auerbach et al. |
| 8,138,917 B2 | 3/2012 | Diener et al. |
| 9,852,565 B2 * | 12/2017 | Engel-Dahan ..... G07C 9/00571 |
| 2005/0134457 A1 | 6/2005 | Rajapakse et al. |
| 2005/0179545 A1 | 8/2005 | Bergman et al. |
| 2009/0066503 A1 | 3/2009 | Lin |
| 2015/0371511 A1 | 12/2015 | Miller et al. |
| 2017/0365121 A1 * | 12/2017 | Horne .................... E05B 49/00 |

OTHER PUBLICATIONS

Datasheet on C-Series Padlock Single Pin that shows table of dimensions and order options.
Datasheet for Hi-G-Tek Lock.

* cited by examiner

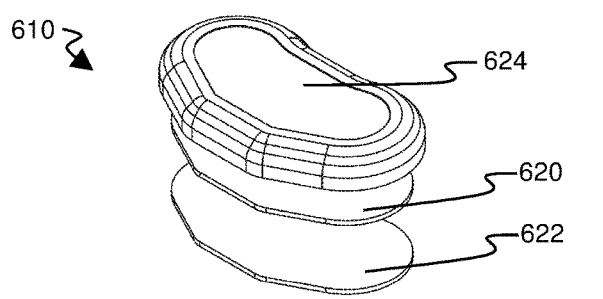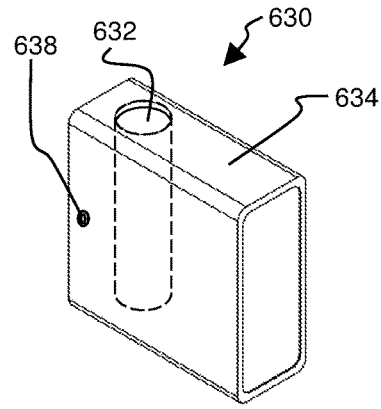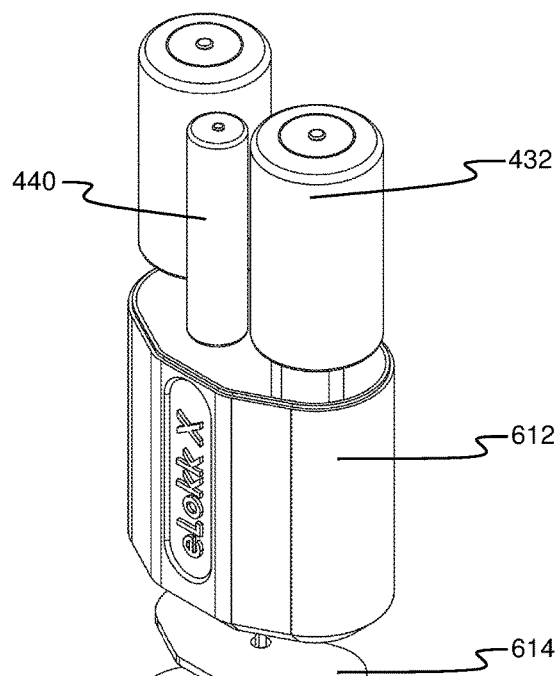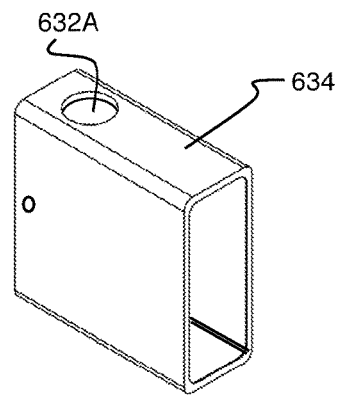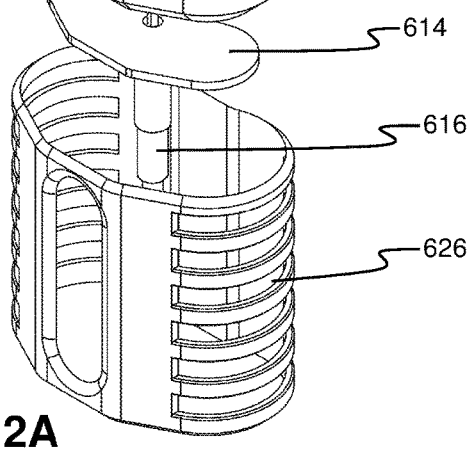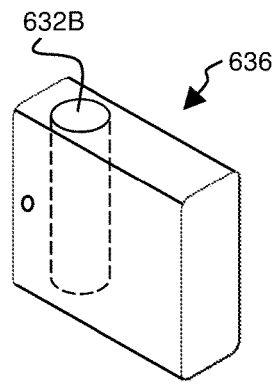
FIG. 12B
FIG. 12C
FIG. 12A
FIG. 12D

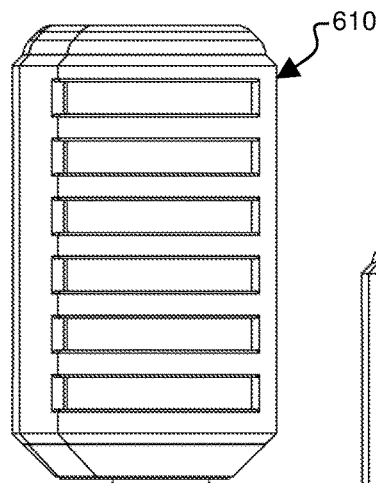
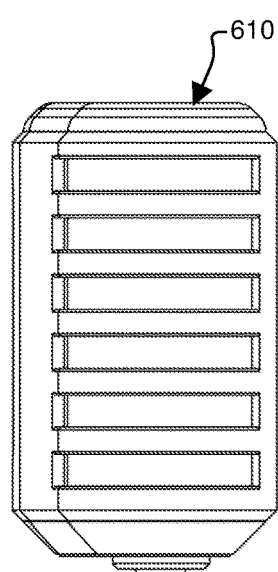
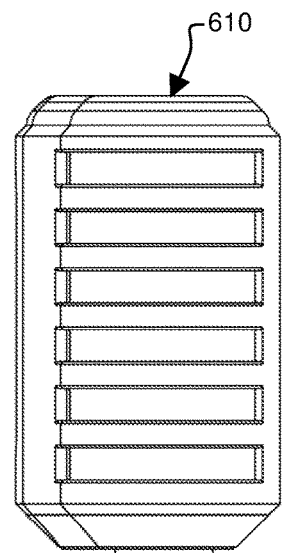
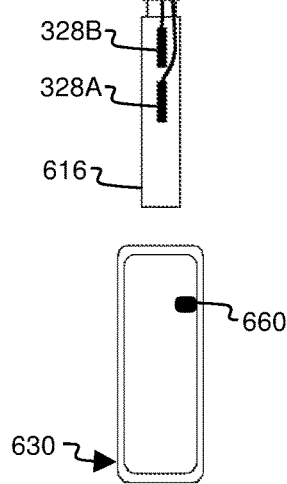
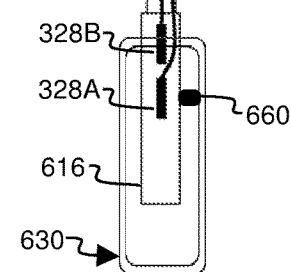
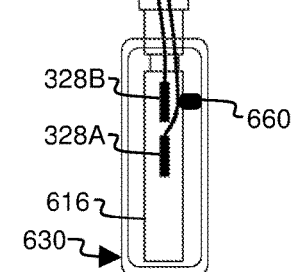
FIG. 14A  FIG. 14B  FIG. 14C

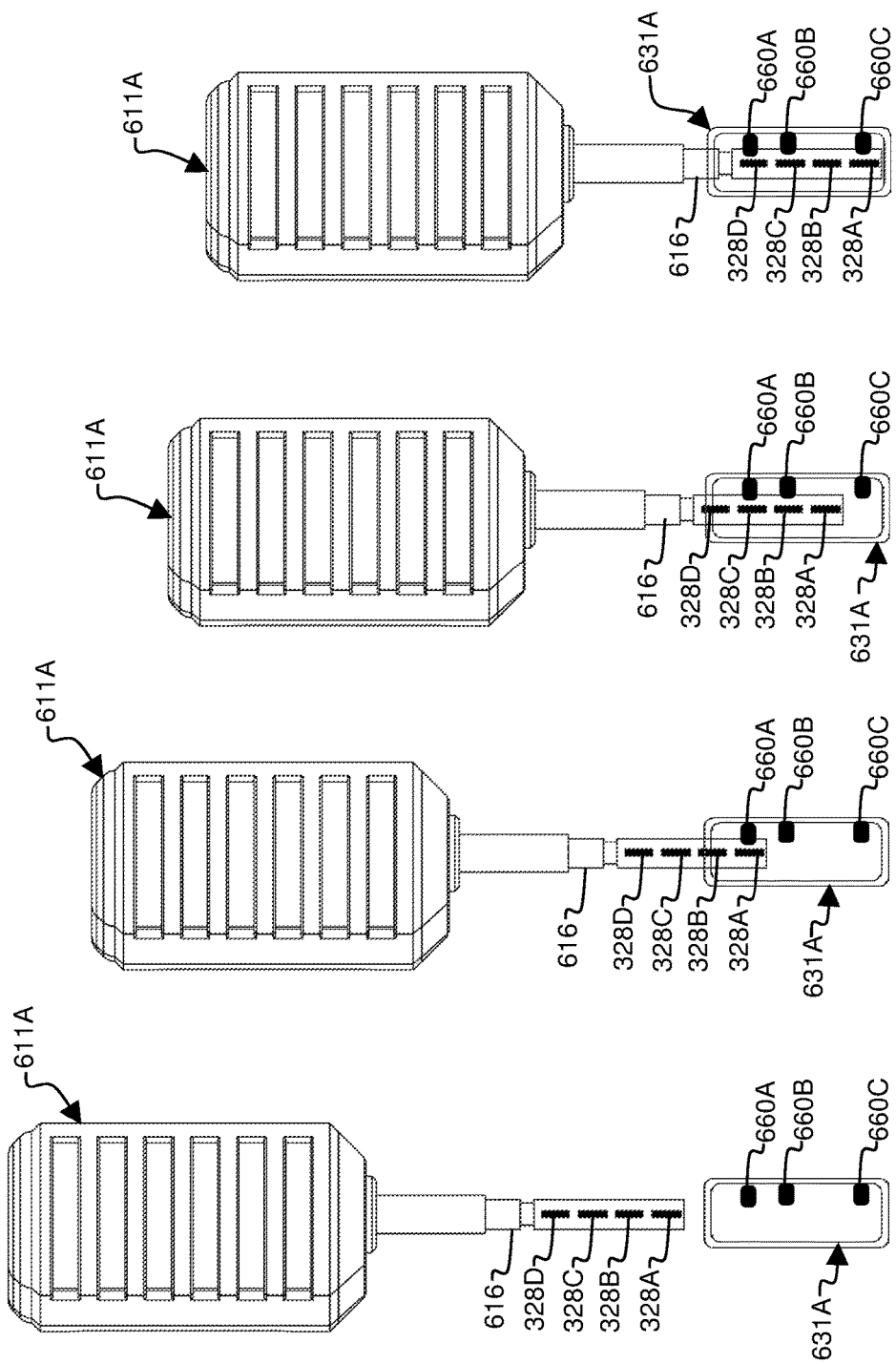

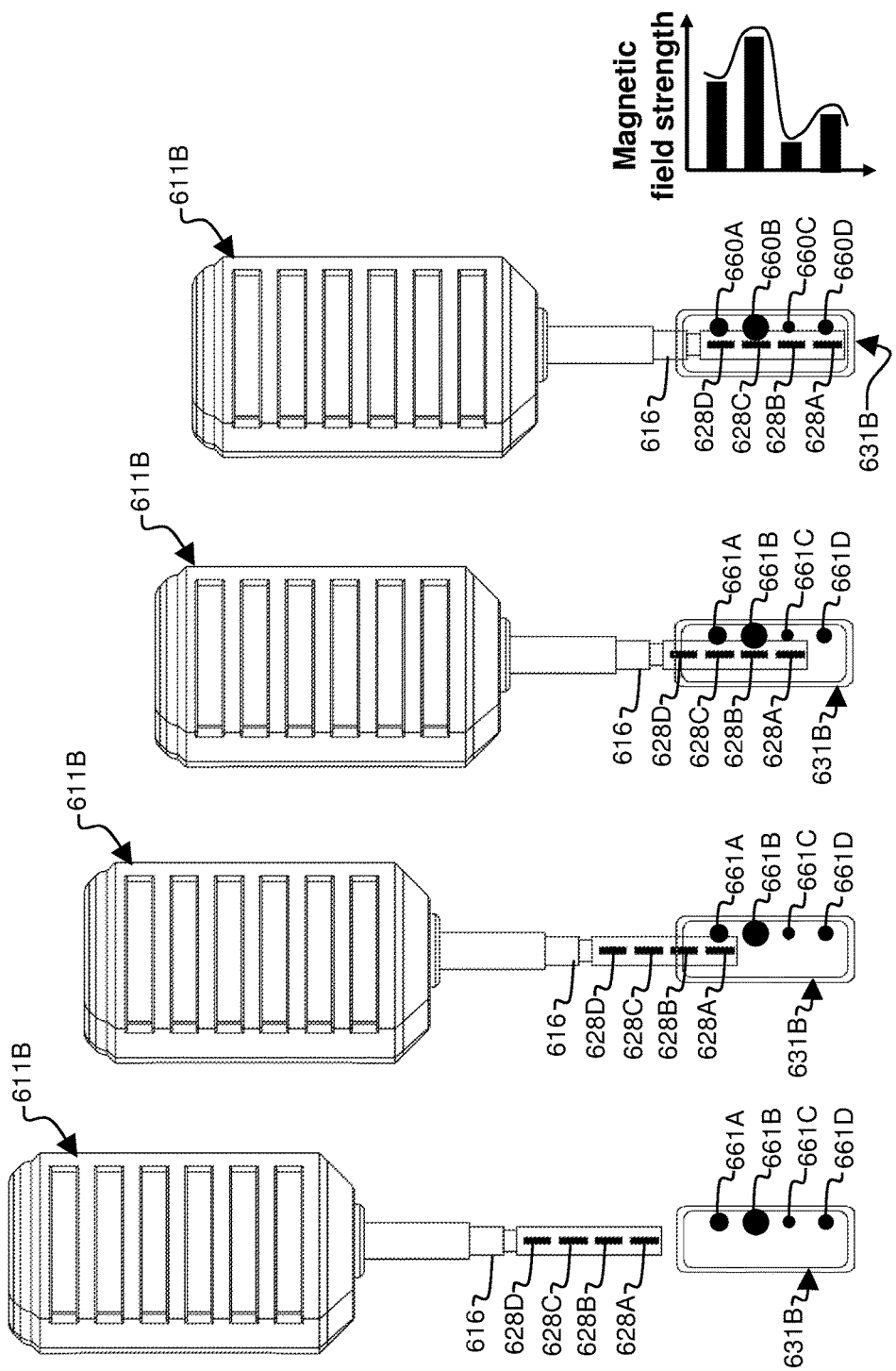

LOCKING SYSTEM AND METHOD FOR A MOVABLE FREIGHT CONTAINER

CROSS REFERENCE TO RELATED APPLICATIONS

This application claims benefit of U.S. Provisional Patent Application Ser. No. 62/480,963 filed 3 Apr. 2017, the entire disclosures of which are incorporated by reference herein.

BACKGROUND

Embodiments of the present invention relate to systems and methods for electronic locking and/or tracking of a movable freight container.

The US Federal Bureau Investigation reports that in 2015 over $30B per year of cargo was lost in the USA due to theft. In many other countries, these theft rates are even higher. Historically, the best solution was to lock the cargo as well as possible. It is desired to use wireless communication technologies, Global Navigation Satellite Systems (GNSS), and the Internet of Things (IoT) to track the location and history of a cargo, either separately or in conjunction with a lock. This can significantly improve cargo security. It can also provide information about the location and history of the cargo.

The following is a list of desirable features for an electronic tracking, monitoring, and/or locking system or method for movable freight containers:

(a) The system and/or method should be as reliable as possible. For example, it needs to work consistently in the typical environment for a freight container, which can include: a broad range of temperatures and exposure to moisture, humidity, shock, vibration, dirt, chemicals, and pollution.
(b) The system and/or method should report and/or record the environment to which it is exposed by recording parameters such as temperature and vibration.
(c) The system and/or method should be configured to operate for long time periods without recharging. This means it should have low power consumption, sufficient battery storage, and the capability of harvesting power while in use.
(d) The system and/or method needs to be tamperproof. If it is tampered with, the system should immediately communicate an alarm and the system location at the time of tampering.
(e) To reduce the possibility of tampering, the system and/or method should be hidden, or be so small and/or unobvious as to not be seen.
(f) The system and/or method should track its location and to communicate this back to the "base" on a regular basis.
(g) The system and/or method needs to be affordable, easy to manufacture, and easy to maintain.
(h) The system and/or method should integrate with industry standard communications technologies and protocols.
(i) The system and/or method should be configured to be used anywhere in the world.
(j) The system and/or method should have multi-level communication capability with other similar systems and other vehicle systems and smart devices carried by mobile individuals, in addition to being IoT enabled.
(k) The system and/or method should incorporate optical, electro-optical and radar sensors such as cameras, lidars and radars.

BRIEF DESCRIPTION OF THE DRAWINGS

For a more complete understanding of the present invention and the advantages thereof, reference is made to the following description taken in conjunction with the accompanying drawings in which like reference numerals indicate like features and wherein:

FIG. 12A is an isometric exploded view of the electronic module shown in FIG. 10A, FIG. 10B; FIG. 10C; and FIG. 11;

FIG. 12B is an isometric view of the mechanical lock module of FIG. 10A, FIG. 10B, FIG. 10C, and FIG. 11;

FIG. 12C is an isometric view of the case for the mechanical lock module of FIG. 12B;

FIG. 12D is an isometric view of the body of the mechanical lock module of FIG. 12B;

FIG. 14A is an end schematic view of the lock module and electronic module shown in the previous figures when the shaft is not inserted into the lock module;

FIG. 14B is an end schematic view of the lock module and shaft module of FIG. 14A when a portion of the shaft is partly inserted into the lock module cavity;

FIG. 14C is an end schematic view of the lock module and shaft module of FIG. 14A when and 14B when the shaft portion is fully inserted into the lock module cavity;

FIG. 15A an end schematic view of an alternate embodiment lock module having three magnets and an alternate embodiment electronic module having four sensors with the shaft not inserted into the lock module;

FIG. 15B shows the lock module and electronic module of FIG. 15A with a portion of the alternate embodiment shaft is partly inserted into the cavity at a position where the top magnet in the lock module is detected by the bottom magnetic sensor in the alternate embodiment shaft;

FIG. 15C shows the lock module and electronic module of FIG. 15A with the alternate embodiment shaft portion inserted into the cavity at a position where the top magnet in the lock module is detected by the second from the top magnetic sensor in the shaft;

FIG. 15D shows the lock module and electronic module of FIG. 15A when the alternate embodiment shaft portion is fully inserted;

FIG. 16A is a second alternate embodiment lock module having four magnets of different field strengths and a second alternate embodiment of the electronic module having four sensors configured to convert detected magnetic field strengths to analog electrical values;

FIG. 16B shows the lock module and electronic module of FIG. 16A with the shaft partly inserted to a position where the top magnet is detected by the bottom sensor in the shaft;

FIG. 16C shows the lock module and electronic module of FIG. 16B with the shaft further inserted to a position where the top magnet is detected by the second from the top sensor in the shaft;

FIG. 16D shows the lock module and electronic module of FIG. 16A with the shaft fully inserted;

FIG. 16E shows a graph of the magnetic field strength of the four magnets in FIG. 16D that is detected by the four sensors in FIG. 16D;

Figure 1:
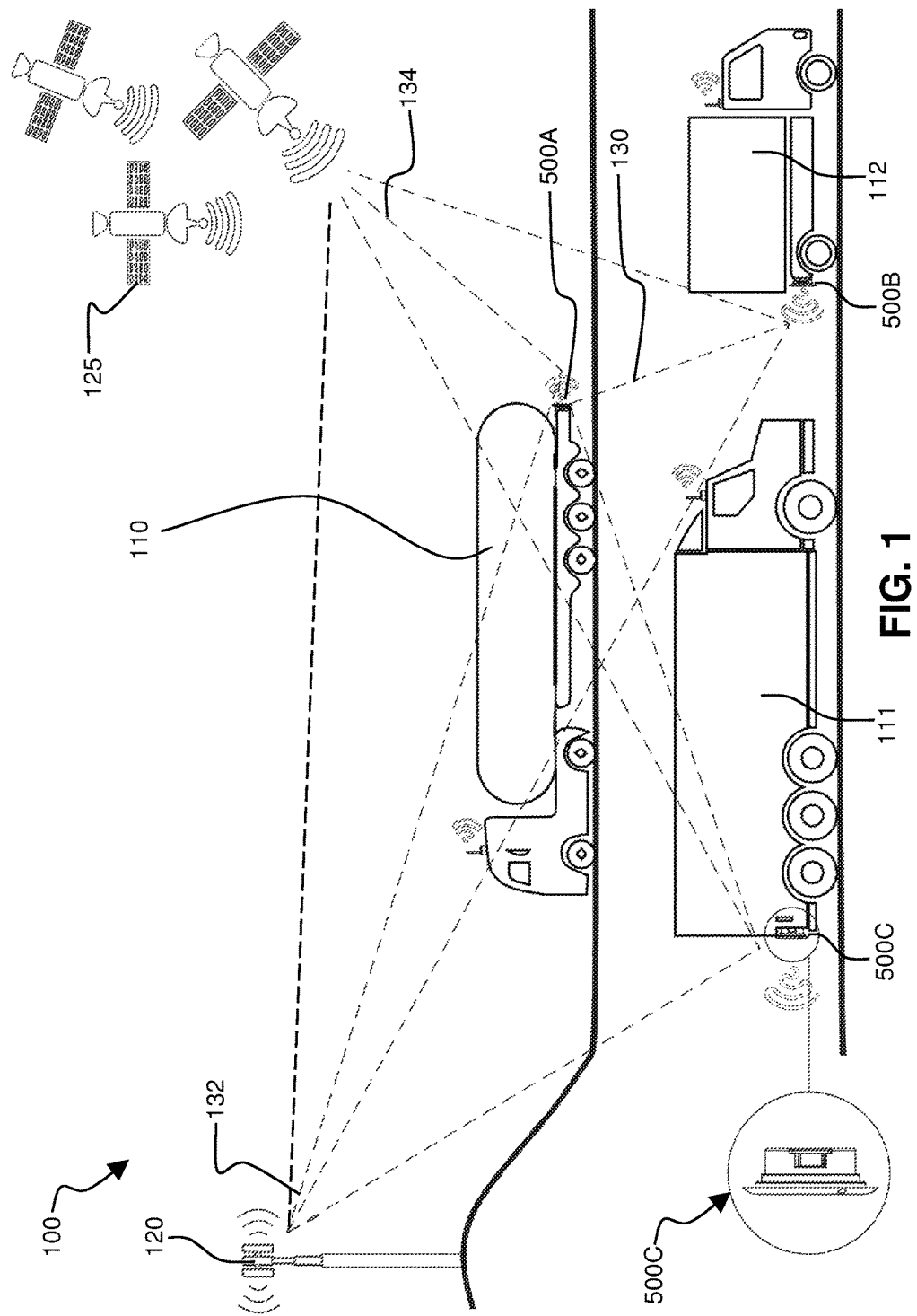
FIG. 1 shows a system for electronic tracking of movable freight containers.

It should be understood that the drawings are not necessarily to scale. In certain instances, details that are not necessary for an understanding of the invention or that render other details difficult to perceive may have been omitted. It should be understood that the invention is not necessarily limited to the particular embodiments illustrated herein.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment.

It should be understood that various changes could be made in the function and arrangement of elements without departing from the spirit and scope as set forth in the appended claims. Preferred embodiments of the present invention are illustrated in the Figures, like numerals being used to refer to like and corresponding parts of the various drawings. Specific details are given in the following description to provide a thorough understanding of the embodiments. However, it will be understood by one of ordinary skill in the art that the embodiments may be practiced without these specific details.

1. Definitions.

For purposes of describing embodiments of the present invention and claims, a movable freight container (hereinafter also called a "container") is defined as any storage unit designed to be filled with cargo, closed, and transported. Examples of movable freight containers include, but are not limited to, a sealable delivery truck cargo compartment, a motor vehicle freight trailer, an intermodal freight container, a railway wagon, and a unit load device for air freight. Typically, movable freight containers are sealed and often they are locked.

For purposes of describing embodiments of the present invention and claims, an electronic tracking and monitoring module (hereinafter also called a "tracking module") is defined as an electronic module: comprising sensors; configured to determine position; and configured to communicate position information. Such a tracking module could be part of a vehicle tail light. Such a tracking module could be part of a lock. Such a tracking module could be part of any other device that is used with a container and has the functionality described herein.

2. Overview of Embodiments of the System and Method.

In one embodiment, the present invention is a system and/or method that comprises a tracking module wherein the system is used for tracking a movable freight container.

(a) Embodiments of the system and/or method can comprise a lock and the lock could comprise the tracking module.

(b) Embodiments of the system and/or method can comprise a tail light and the tracking module could be hidden in the tail light, or in another light, or in another location while taking electric power from a circuit configured to provide electricity to an electric light.

(c) Embodiments of the present invention could be configured for determining position by using a global navigation satellite system (GNSS) such as the global positioning system (GPS) or any other space-based radio-navigation system such as the European Galileo, the Chinese BeiDou-2, or the Russian GLONASS system.

(d) Embodiments of the present invention could be configured for determining position by using information gathered from radio transmissions sent to or received from terrestrial-based transmitters in known locations.

(e) Embodiments of the present invention could be configured for determining position by using "dead reckoning" from a known position when updated position information from satellites, terrestrial-based radio transmission, or other sources of location information are not available. This "dead reckoning" could use velocity (direction and speed) information in conjunction with time information to determine a new location from a known previous location.

(f) Embodiments of the present invention could use a Kalman filter, a Madgwick filter, a Mahoney filter, and/or any similar digital electronic motion information filter and/or fusion system or method in conjunction with an IMU (inertial measurement unit) for tracking acceleration, velocity, position, orientation, rate of change of orientation, or similar information. This processed information from the IMU could be used for "dead reckoning" of a position.

(g) The digital electronic motion information filter can use quaternions to make its determination of acceleration, velocity, position, orientation, rate of change orientation, and or similar information. These quaternion methods could be used for "dead reckoning" of a position.

(h) Embodiments of the present invention could measure and record temperature and/or humidity in addition to other information described herein.

(i) Embodiments of the present invention could maintain a log of sensed information such as location information, orientation information, temperature information, humidity information, shock information, and/or vibration information.

(j) Embodiments of the present invention could sense high G-force (high acceleration) impacts and determine their magnitudes and such high G-force impacts could include accelerations up to 500× the acceleration of gravity.

(k) Embodiments of the present invention could incorporate dual-SIM (subscriber identify module) functionality that allows the embodiments to communicate over more than one cellular communication network for redundancy purposes.

(l) Embodiments of the present invention could incorporate IoT (internet of things) communication technology such as Bluetooth Low Energy, ZigBee, XBee, 6LoW-PAN, Z-Wave, IoT over near field communications, Sigfox, Neul, and/or LoRa. This IoT technology could use the Message Queuing Telemetry Transport (MQTT) protocol.

(m) Embodiments of the present invention could incorporate ultra-high bandwidth communication capability to other devices in radio range and this ultra-high bandwidth wireless transmission can be done in a mesh fashion using multiple input multiple output (MIMO) antennas, wherein the ultra-high bandwidth can comprise operation in wavelengths of between 0.1 millimeter and 10 millimeters and the ultra-high bandwidth could use bandwidths in excess of 500 Mhz to send data at rates exceeding 1 gigabit per second. This ultra-high bandwidth communication could use pulses having a length of less than 60 cm or even less than 30 cm in some cases which minimizes fading and/or noise caused by signal reflections that overlap the original pulse. The system can also use coding techniques to reduce the impact of degradation caused by multi-path propagation and inter-pulse interference.

(n) Embodiments of the present invention could use a power-saving sleep mode for the main processor and could comprise another processor to wake up the sleeping processor.

(o) Embodiments of the present invention could incorporate vibration energy harvesting and such vibration energy harvesting can comprise a piezoelectric movement energy harvesting element.

(p) Embodiments of the present invention could incorporate truck-to-truck communication, truck-to-vehicle communication, and truck-to-fixed-asset communication. Truck-to-fixed-asset communication means communication between a mobile freight container or a truck and readers on high passage gates (including optical character recognition gates) at ports, borders, and container yards, as well as readers that could be placed on telecommunications towers or power distribution poles. Such truck-to-truck, truck-to-vehicle, and truck-to-fixed-assets communication could help extend the range of the communications system through mesh connectivity and would enable real-time logistics optimization, safer driving, and system tracking when satellite-based positioning (such as GPS) and/or terrestrial radio transmission positioning information is unavailable. This might be especially beneficial in vehicles with autonomous capability including platoons of autonomously driven cargo trucks.

(q) Embodiments of the present invention could incorporate optical, electro-optical and radio frequency and microwave sensors. These sensors would complement the communication with other trucks, vehicles and individual smart devices for safer driving, position localization and cargo security.

(r) Embodiments of the present invention could incorporate geofencing capabilities. This geofencing could use GNSS information to create a virtual geographic boundary for the device that triggers an alarm when the device enters or leaves a particular area.

It should be noted that embodiments of the present invention can incorporate any combination of the above attributes in any combination and configuration capable of being understood by anyone skilled in the art.

3. Description of Embodiments

FIG. 1 shows a movable freight container electronic tracking and monitoring system 100 that uses an electronic tracking and monitoring device hidden in a vehicle tail light. In FIG. 1, such tail lights are shown at 500A, 500B, and 500C. The tail light 500A could be attached to a truck trailer 110. The tail light 500C could be attached to a cargo truck 111. The tail light 500B could be attached to a local delivery vehicle 112. The tail light 500A could receive information from positioning satellites 125 such as those used for the Global Positioning System (GPS) maintained by the United States, the European Galileo, the Chinese BeiDou-2, or the Russian GLONASS system. This communication connection between the tail light 500A and the positioning satellites 125 is shown at 134. The tail light 500A could also communicate wirelessly and bi-directionally with a terrestrial system such as the communication tower shown at 120, through a wireless communication connection shown at 132. The terrestrial wireless communication tower 120 could communicate using a mobile phone protocol. The terrestrial wireless communication tower 120 could communicate using an IoT (Internet of Things) communication systems and method, such as Bluetooth Low Energy, ZigBee, 6LoW-PAN, Z-Wave, IoT over near field communications, Sigfox, Neul, and LoRa. This IoT technology could use the Message Queuing Telemetry Transport (MQTT) protocol. There could be multiple and redundant communications towers, one or more of which use a mobile phone technology and one or more of which use an IoT technology. The tail light 500A on one vehicle could also communicate with a tail light on another vehicle 500B through a wireless interfleet communication connection 130. More generally, a tail light on one vehicle could also communicate with the communications system of other vehicles on the road with similar capability, including self-driven vehicles and the communications systems of fixed assets and fixed structures including trucks and containers scanners, borders barriers, toll systems and similar road and highway assets and structures.

Figure 2:
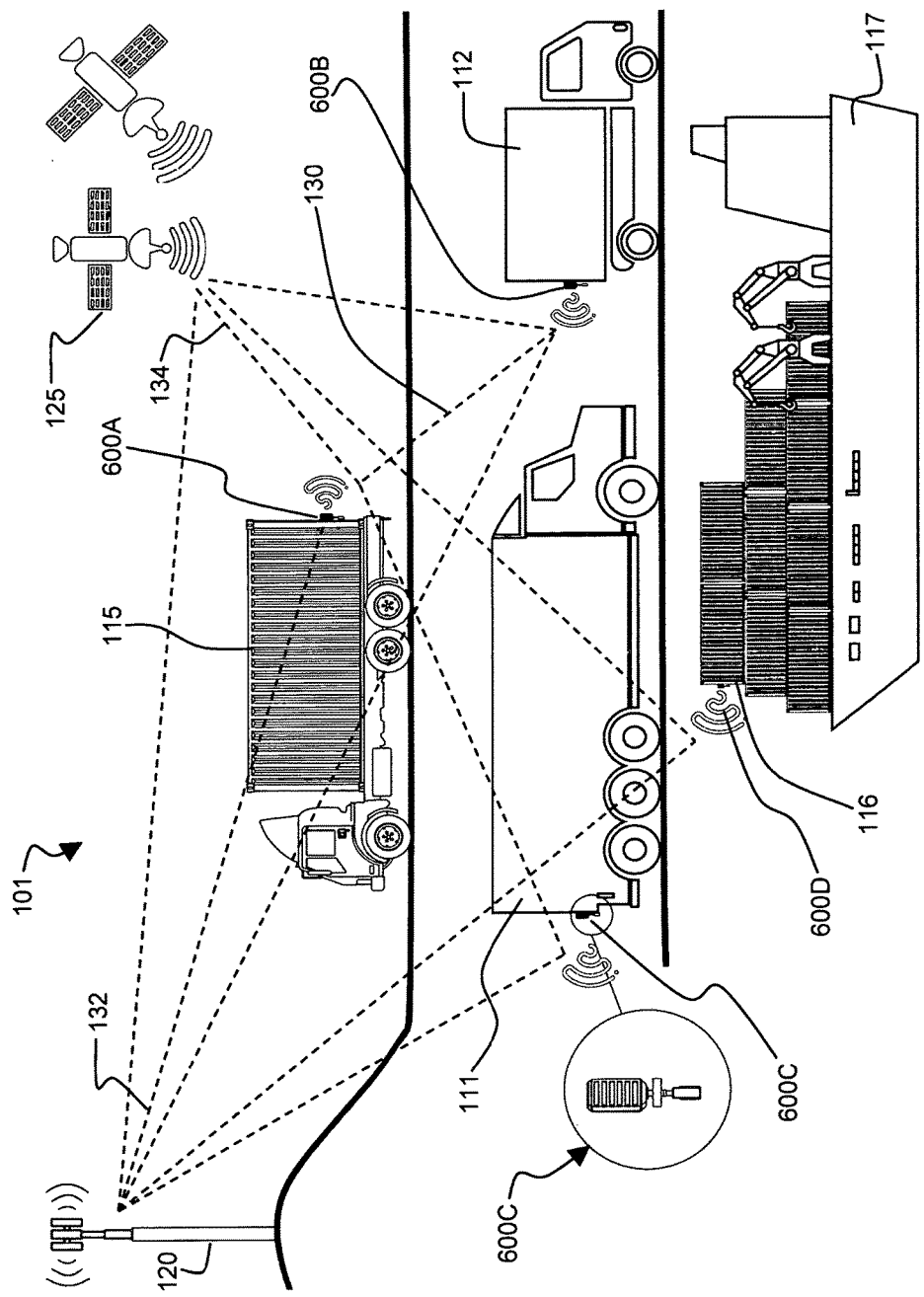
FIG. 2 shows an alternate system for electronic tracking of movable freight containers.

FIG. 2 shows an alternate movable freight container electronic tracking and monitoring system 101. The alternate system 101 uses one or more locks that are also an electronic tracking and monitoring device, as shown at 600A, 600B, 600C, and 600D. The electronic lock 600A could be used to secure a truck-mounted container 115. The electronic lock 600B could be used to secure a cargo compartment of a local delivery vehicle 112. The electronic lock 600C could be used to secure a cargo compartment of a cargo truck 111. The electronic lock 600D could be used to secure a container 116 on a ship 117. The electronic lock could be used to secure any container that is at a temporary storage facility (not shown) and more generally any movable storage container located anywhere capable of being understood by anyone skilled in the art.

Further referring to FIG. 2 in view of FIG. 1, the communication connection with a positioning satellite 134, the communication connection with a tower 132, and the communication connection between electronic devices 130 can operate in a fashion similar to what was described for the system shown in FIG. 1. The positioning satellite or satellites 125 and communication tower or towers 120 can also be similar to those described with reference to FIG. 1. It is also possible to combine any element of the system shown in FIG. 1 with the system shown in FIG. 2 and vice versa.

Figure 3:
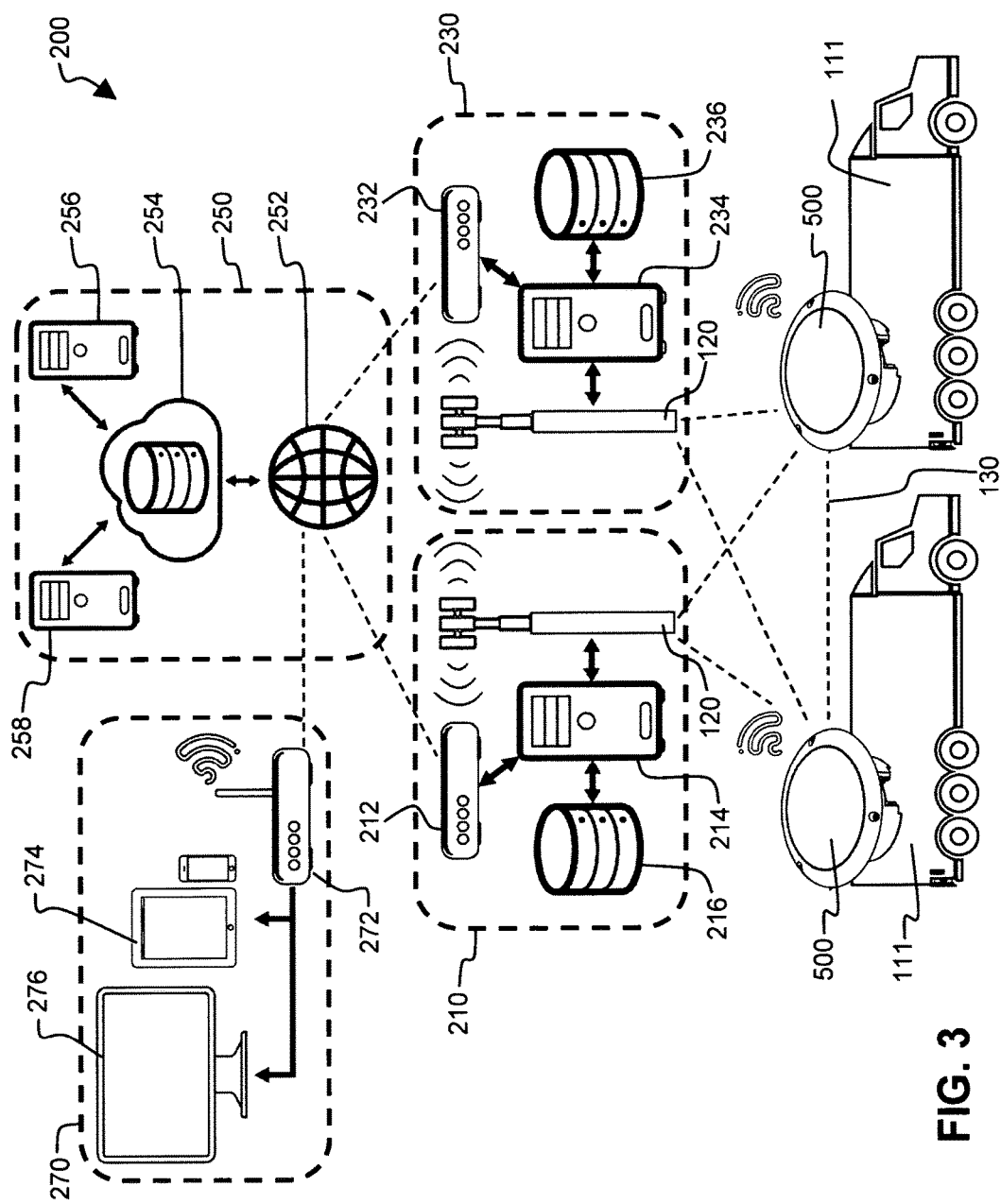
FIG. 3 shows a network topology for the system of FIG. 1.

FIG. 3 shows a network topology for electronic tracking of movable freight containers 200 in which cargo trucks 111 with tail lights 500 communicate with one or more communication towers 120 and with each other 130. In the embodiment shown in FIG. 3, the cargo trucks 111 can communicate with both a cellular (i.e. mobile phone) network 210 and an IoT network 230. The cellular network 210 can comprise one (or more) communications tower(s) 120, a cellular network modem 212, a cellular network server 214, and a cellular network database 216. The IoT network 230 can comprise one (or more) communications tower(s) 120, an IoT network modem 232, an IoT network server 234, and an IoT network database 236.

The cellular network server 214 and database 216 can be used to process and store data received from the tail lights 500 and/or the IoT network server 234 and database 236 can be used to process and store data received from the tail lights 500. The following table shows examples of the type of data that could be stored and the structure of this data:

| Device ID | Datatype | Value | Time Stamp (YYYY-MM-DD-HH-MM-SS) |
|---|---|---|---|
| eCAT-958 | Position | 32.2588°, 50.3698°, 150 m E | 20171206181223 |
| eCAT-958 | Impact | True | 20171209180738 |
| eCAT-958 | PCB temperature | 80° F. | 20171209180738 |
| eCAT-958 | Truck temperature | 76° F. | 20171209180738 |
| eCAT-958 | Tire pressure | 26 PSI | 20171209180738 |
| eCAT-958 | Truck ID | 12584889 | 20171209180738 |
| eCAT-958 | Tire FL ID | 25842287 | 20171209180738 |
| eCAT-958 | Speed | 45 miles/hour | 20171209180738 |
| eCAT-958 | Battery2 voltage | 3.5 V | 20171209180738 |

Further referring to FIG. 3, the cellular network 210 can communicate with a cloud server 250 through a cellular network modem 212 that connects the cellular network server 214 to the internet 252. Similarly, the IoT network 230 can communicate with the cloud server 250 through an IoT network modem 232 that connects the IoT network server 234 to the internet 252. The cloud server 250 can further comprise a cloud database 254, a cloud analysis server 256, and a cloud data collection server 258.

The embodiment shown in FIG. 3 also comprises a remote access module 270 that can include a remote access modem 272 configured for communication with the cloud server 250 via the internet 252. The remote access module 270 can include a mobile device interface 274 configured for connection to devices such as a tablet computer or a smart phone. The remote access module 270 could also have a computer device interface 276 configured for connection to a computer such as a laptop or desktop that has a keyboard, graphical user interface, mouse, etc. The remote access module 270 could be used for reporting data from the tail lights 500, programming the tail lights 500, and/or other functions that will be further described in other parts of this document.

Figure 4:
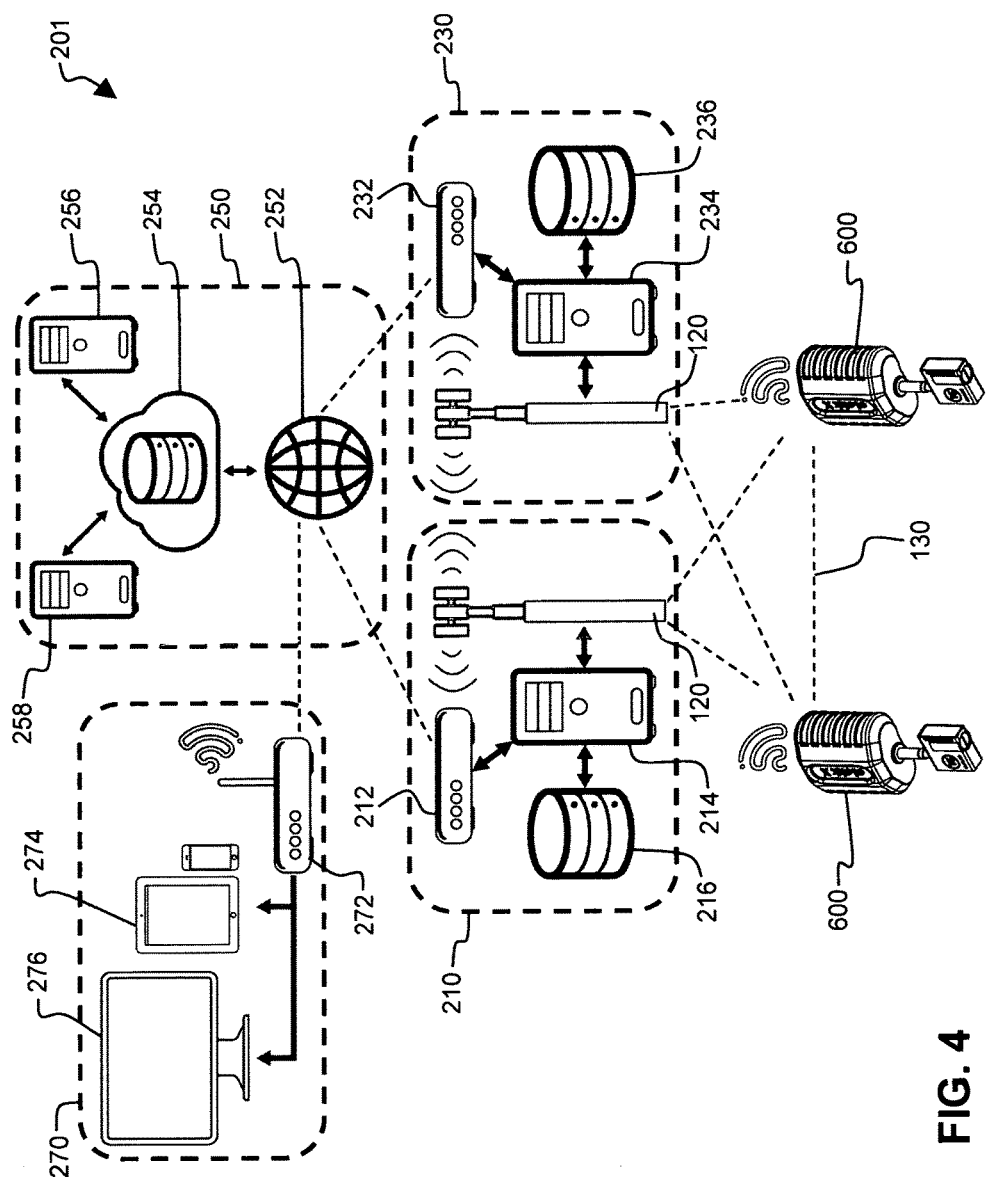
FIG. 4 shows a network topology for the system of FIG. 2.

FIG. 4 shows an alternate network topology for electronic tracking of movable freight containers in which one or more electronic tracking and monitoring locks 600 communicate with one or more communication towers 120 and with each other 130. In the embodiment shown in FIG. 4, the electronic locks 600 can communicate with both a cellular (or mobile phone) base station 210 and an IoT base station 230 and this communication and the other elements shown in FIG. 4 serve the same functions as the similarly numbered elements that were shown and described with reference to FIG. 3. It is also possible to combine any element of the system shown in FIG. 3 with the system shown in FIG. 4 and vice versa. The system can also be configured so that any device such as any lock shown at 600 or any tail light shown at 500 could be controlled by external operators via the mobile device interface 274 or the computer device interface 276.

Figure 5:
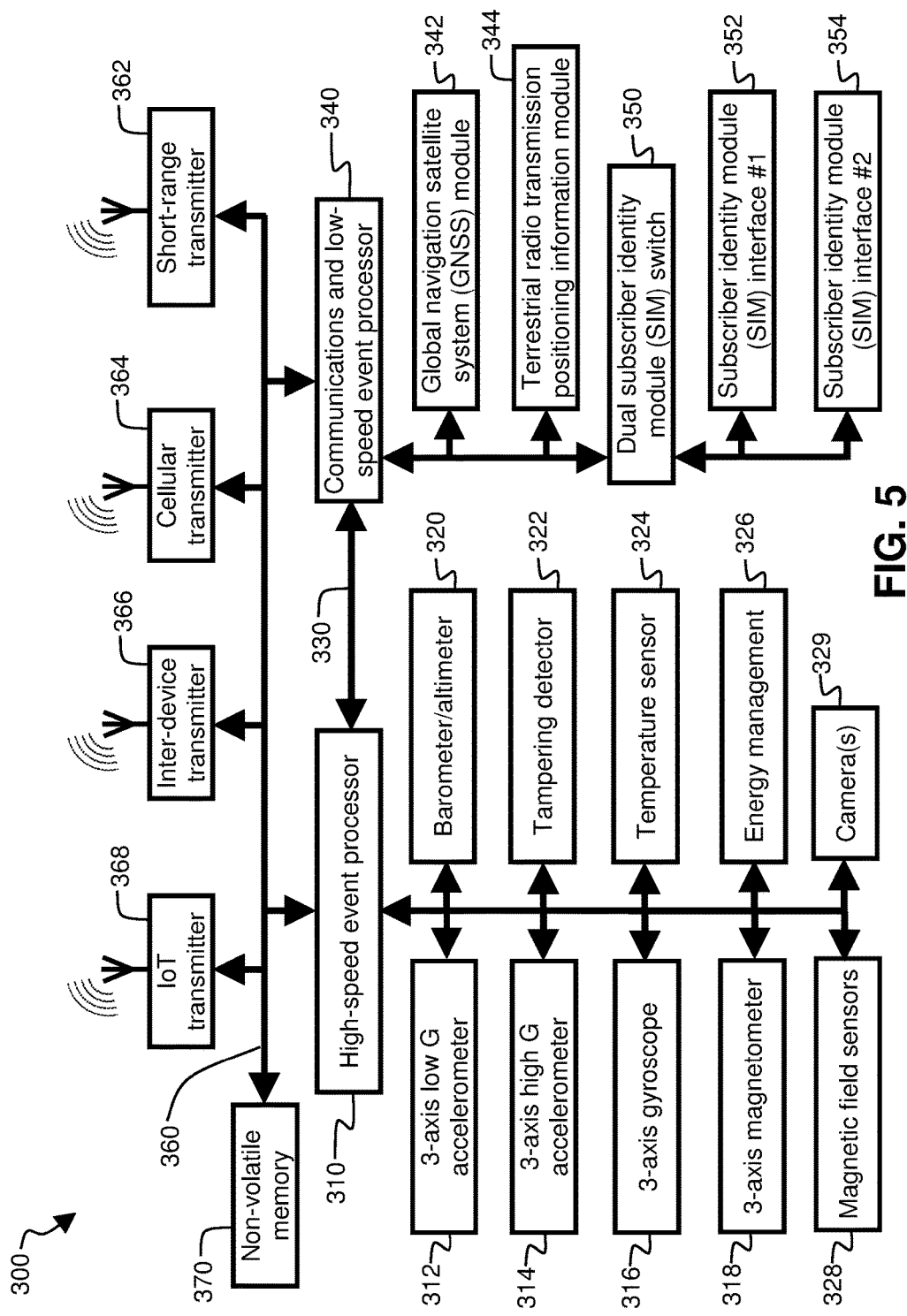
FIG. 5 shows a block diagram of the main functional elements of the tracking devices shown in FIG. 1, FIG. 2, FIG. 3 and FIG. 4.

FIG. 5 shows a block diagram of the main functional elements of an electronic tracking and monitoring module 300. In one embodiment, the electronic tracking and monitoring module 300 comprises a high-speed event processor 310 and a low-speed event processor 340 that share a processor communication link 330. In one embodiment the processor communication link 330 is a dedicated serial connection. This serial connection can use a universal synchronous and asynchronous receiver-transmitter and could run in either a synchronous mode or an asynchronous mode. The processor communication link 330 can operate in a full duplex serial communication mode.

In the embodiment shown in FIG. 5, the high-speed event processor 310 can be connected to a 3-axis low g-force accelerometer 312, a 3-axis gyroscope 316, and a 3-axis magnetometer 318. These devices (the low g-force accelerometer 312, gyroscope 316, and magnetometer 318) can be in a single 9 degree of freedom insertional measurement unit (9-DOF IMU). The implementation of the IMU in embodiments of the present invention will be further described later in the document with reference to FIG. 12A, FIG. 12B, FIG. 13, and FIG. 14. The system can also include a 3-axis high g-force accelerometer 314, a barometer/altimeter 320, a tampering detector 322, a temperature sensor 324, and an energy management circuit 326.

The system could also include a camera or cameras, as shown at 329. This camera or cameras could be used as part of a multi-factor authentication process using iris or face scanning The system could also use other biometrics, such as fingerprints.

If the embodiment shown in FIG. 5 is used as an electronic lock, the high-speed event processor 310, could also communicate with magnetic field sensors (magnetic sensors), as shown at 328, the functionality of which will be further described later in this document. These magnetic field sensors 328 could be used to generate an alarm signal which could be stored and/or transmitted using any of the functionality described in this document.

Further referring to FIG. 5, the low speed event processor 340 can be connected to a global navigation satellite system (GNSS) module 342, a terrestrial radio transmission positioning information module 344, and a dual subscriber identity module (dual SIM) switch 350. The dual SIM switch 350 in turn will connect with a first subscriber identity module (SIM) interface 352 and a second subscriber identity module (SIM) interface 354. The two SIM interfaces 352 and 354 can connect to subscriber identity module cards (SIM cards) that store an international mobile subscriber identity (IMSI) number and its related key, which are used to identify and authenticate subscribers on mobile telephony devices. More generally, a SIM card can be referred to as smart cards or universal integrated circuit cards (UICCs). A SIM card typically stores its unique serial number (ICCID), international mobile subscriber identity (IMSI) number, security authentication and ciphering information, temporary information related to the local network, a list of services the user has access to, and two passwords: a personal identification number (PIN) for ordinary use and a personal unblocking code (PUK) for unlocking. Two SIM interfaces 352 and 354 can be used so the system 300 can use two different SIM cards for two different mobile phone networks to provide backup if the system 300 is in a location where one of the mobile phone networks is not available. The dual SIM switch 350 can be any device configured for electronically multiplexing more than one SIM connection. It is a multi-pole double-throw switch so that all of the necessary active connections of a typical subscriber identity module (SIM) are switched from one SIM to another. One example of such as switch is the FSA2567 made by Fairchild Semiconductor Corporation. In one embodiment, the system can be configured so that one or more of the subscriber identity modules (SIMs) can be non-removable SIMs, which are typically called embedded SIMs or eSIMs.

The terrestrial radio transmission positioning information module 344 can be configured to detect the distance and/or direction from the electronic tracking and monitoring module 300 to a plurality of communication towers (120 in FIG. 1/2/3/4) an/or receive detected information of the distance and/or direction from a plurality of communication towers (120 in FIG. 1/2/3/4) to the electronic tracking and monitoring module 300. Techniques for measuring distance and/or direction between one or more communication towers and the device or vice versa can include multilateration (also known as hyperbolic navigation), trilateration timing, triangulation, relative transmission power level measurement, Cell ID (unique number used to identify each base station transceiver or sector of a base station transceiver), angular direction determination from an antenna pattern, antenna phase discrimination, and other techniques for signal direction finding. The Cell ID, distance, and/or direction information can then be further improved through averaging, interpolation, and other types of computation to determine a relative location. Having determined a relative position of the electronic tracking and monitoring module 300 to the towers (120 in FIG. 1/2/3/4), absolute location of the module 300 can then be calculated based on combining the relative position information with known and unchanging absolute position information for the towers (120 in FIG. 1/2/3/4).

The terrestrial radio transmission positioning information module 344 can also work in conjunction with the GNSS module 342 to improve the speed or accuracy of a position for the module 300 by using Assisted Global Positioning System (A-GPS) techniques. These A-GPS techniques can comprise (a) receiving orbital data or almanac information more quickly from a terrestrial tower (120 in FIG. 1/2/3/4) than would be available from a GNSS satellite and/or (b) calculation of the position of the module by combining information received by the module 300 from the GNSS satellite (125 in FIG. 1 and FIG. 2) with information received by the terrestrial tower (120 in FIG. 1/2/3/4) from the GNSS satellite (125 in FIG. 1 and FIG. 2).

The tampering detector 322 in FIG. 5 can be configured to detect any attempt by a person to open the electronic tracking and monitoring device (500 in FIG. 1 and FIG. 3 or 600 in FIG. 2 and FIG. 4). In one embodiment, the tampering device 322 is a switch that is configured to detect opening of the electronic tracking and monitoring device, 500 or 600. The tampering detector 322 could also be implemented using a different type of sensor such as a magnetic sensor, a light sensor, or any other technology capable of being understood by anyone skilled in the art.

The electronic tracking and monitoring module 300 in FIG. 5 can be configured with a short-range communications transmitter 362, a cellular communications transmitter 364, inter-device communications transmitter 366, and an IoT (Internet of Things) communications transmitters 368. In one embodiment these communications transmitters (362, 364, 366, and 368) are managed by the low-speed event processor 340 over a communications bus 360. The electronic tracking and monitoring module 300 can also comprise a non-volatile memory 370 that can be used for logging data from any of the devices in the module 300. This non-volatile memory 370 could be flash memory that could be used to log and store measured data during the time when no data transmission can occur. The logged data can then be transmitted once a transmission connection is re-established. The logged data can comprise position information and event information, such as impacts and impact intensity, temperatures and other environmental parameters, and lock openings and closings, as well as other information associated with any element of the system shown in FIG. 5. This logged information could be stored with time stamps and this time stamp information can then be later used to reconstruct a timeline of everything that has happened to the electronic tracking and monitoring module 300 and associated cargo.

The data stored in the non-volatile memory, 370 in FIG. 5, can comprise magnetic field alarm information, inertial information, geographic position information, environmental information, and tampering alarm information. This information could be encrypted. Data stored in other parts of the system including, but not limited to data stored in the remote access module, 270 in FIG. 4, data stored in the cloud database, 254 in FIG. 4, data stored in the cellular network 210 in FIG. 4, and data stored in the IoT server, 230 in FIG. 4, could also be encrypted. Similarly, all transmission of data between any component in the system as shown in FIG. 1, FIG. 2, FIG. 3, FIG. 4, and FIG. 6 could be encrypted.

The cellular transmitter 364 in FIG. 5 can be used for bi-directional communication with the communication tower 120, shown in FIG. 1, FIG. 2, FIG. 3 and FIG. 4 and the cellphone network 210 in FIG. 3 and FIG. 4. The IoT transmitter 368 in FIG. 5 can be used for bi-directional communication with the communication tower 120, shown in FIG. 1, FIG. 2, FIG. 3 and FIG. 4 and the IoT network 310 in FIG. 3 and FIG. 4. The inter-device transmitter 366 in FIG. 5 can be used for bi-directional communication between electronic tracking and monitoring devices, such as the taillights 500 shown in FIG. 1 and FIG. 3 and/or the electronic locks 600 shown in FIG. 2 and FIG. 3.

The short-range transmitter 362 in FIG. 5 can be used for wired or wireless mesh networking or for a Bluetooth connection with peripherals, such as tablets that could download data from the electronic tracking and monitoring module 300. In one embodiment, the short-range transmitter 362 in FIG. 5 is part of a wireless mesh network, such as the one illustrated in FIG. 6.

Figure 6:
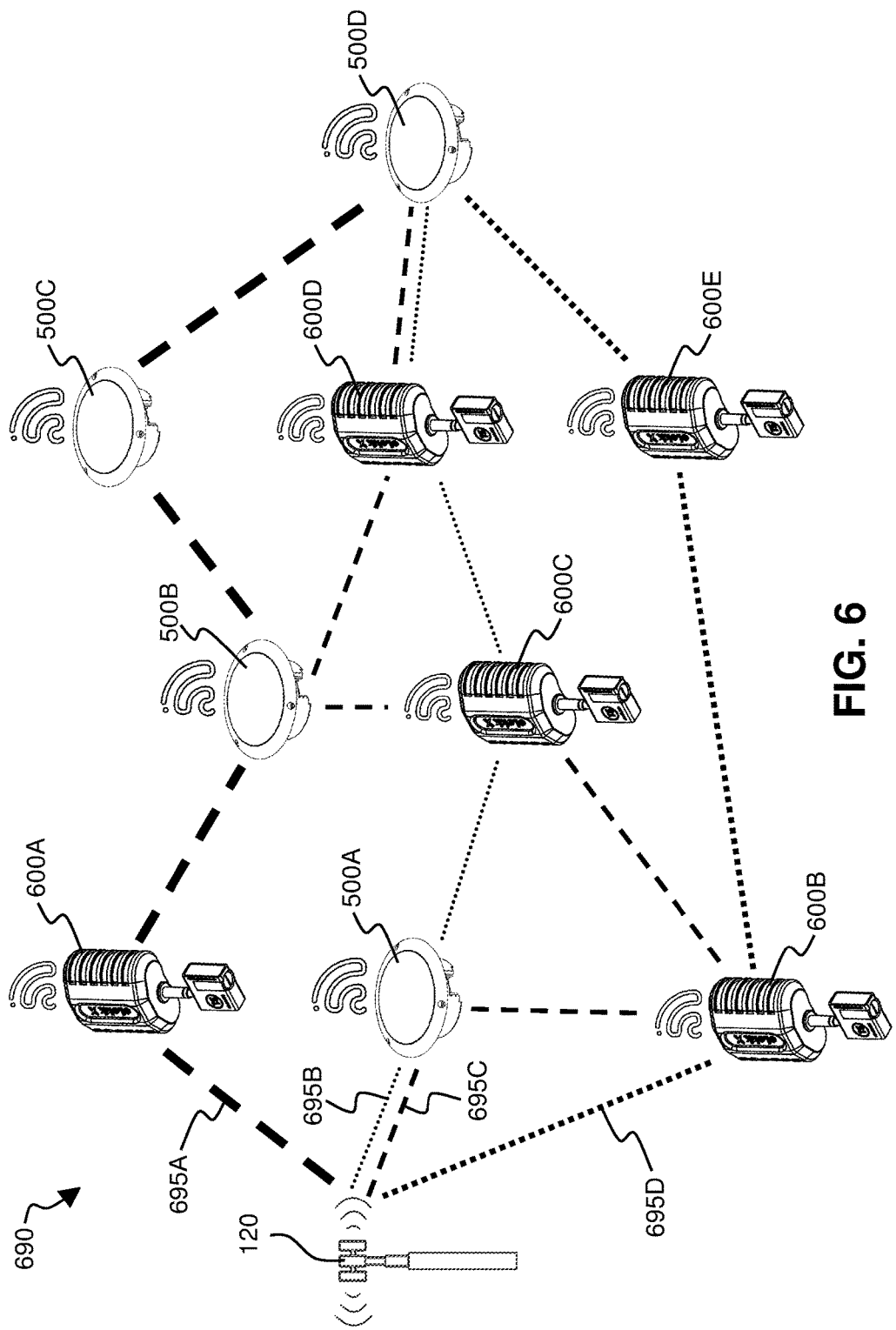
FIG. 6 illustrates an embodiment of the system comprising a mesh network.

Referring in more detail to FIG. 6, a mesh network, and more specifically a wireless mesh network is shown at 690. The wireless mesh network 690 provides a plurality of communication nodes (more specifically wireless communication nodes) between the communication tower 120 and an electronic tracking and monitoring device 500D. The specific device shown at 500D is a device configured to be hidden in a vehicle tail light, as was described previously. The wireless mesh network 690 comprises a plurality of possible communication paths, shown at 695A, 695B, 695C, and 695D between the communication tower 120 and the electronic tracking and monitoring device 500D using a variety of nodes, shown at 500A, 500B, 500C, 600A, 600B, 600C, 600D and 600E. Each path has been shown with a different type of dotted line. For example, path 695A goes to and from the communication tower 120 via lock 600A, tail light 500B, tail light 500C, and tail light 500D. The communication path for the data can be chosen on an ad hoc basis based on performance parameters such as available communication bandwidth, availability of a node or nodes for communication, minimization of number of hops, signal error rates, and any other parameter capable of being understood by anyone skilled in the art. The communication tower 120 could be replaced by any other communication gateway such as a WiFi router, a cellphone tower, a communications satellite, a Zigbee or Xbee communications gateway or any other communications device capable of being understood by anyone skilled in the art. Communication between nodes could be using any wired or wireless communication protocol such as WiFi, Xbee, Zigbee, etc.

Figure 7:
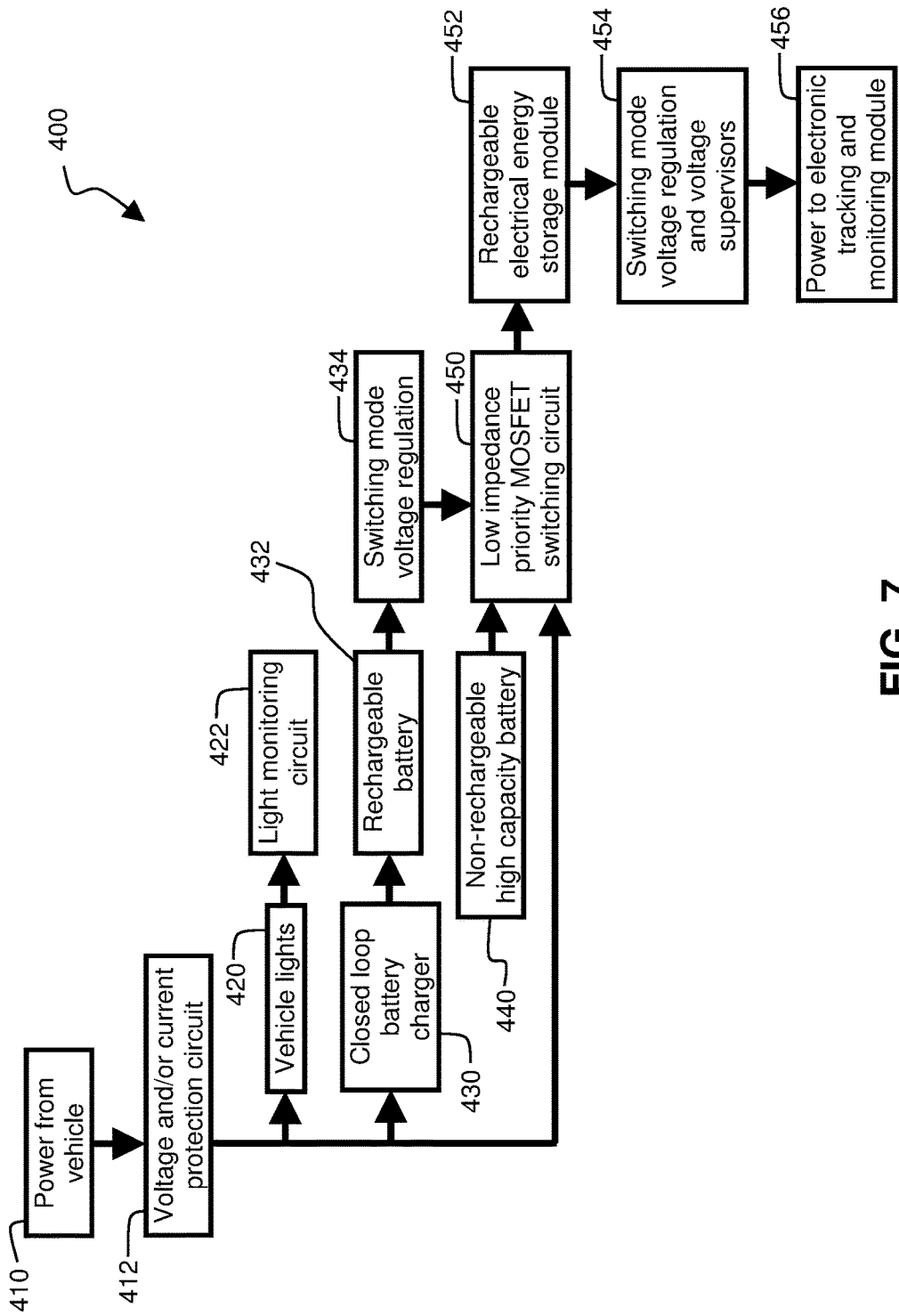
FIG. 7 shows a block diagram of a power module for the tracking devices of FIG. 1 through FIG. 5.

FIG. 7 illustrates an electrical power circuit 400 that can be used with embodiments of the present invention. The electrical power circuit 400 shown in FIG. 7 is configured for situations in which external electrical power is available. More specifically, the embodiment shown in FIG. 7 receives power from a vehicle, as shown at 410. A voltage and/or current protection circuit 412 can be used to protect the device from being plugged into the wrong voltage or to protect against voltage and /or current spikes. Such a protection circuit 412 can comprise a fuse, a zener diode, and/or a thyristor. The protected electrical power can then be used to power vehicle lights 420, a battery charger 430, and a switching circuit. The vehicle lights 420, could be incandescent, they could be halogen lights, they could be LED lights, and/or they could be any other electrical illumination source capable of being understood by someone skilled in the art. The vehicle lights 420 could be connected to a light monitoring circuit 422 that determines whether the lights are burning by determining whether they are drawing current.

Further referring to FIG. 7, the battery charger 430 can be a configured to provide electrical power to a rechargeable battery 432 in a closed-loop fashion in which the charger output current and/or voltage are regulated in response to a comparison with a reference value. The rechargeable battery 432 can use any electrical energy storage technology capable of being of understood by anyone skilled in the art such as alkaline, lithium ion, lithium polymer, lithium phosphorous, nickel cadmium, nickel metal hydride, zinc oxide, and lead acid. The system can also comprise a non-rechargeable high capacity battery 440. The rechargeable battery 432 and non-rechargeable battery 440 provide backup in case the power from the vehicle 410 (as regulated by the voltage and/or current protection circuit 412) is not available.

As shown in FIG. 7, the source of power from either of the batteries, 432 and 440, or the vehicle power 410, can be selected by means of a switching circuit, shown at 450. The electrical power from the rechargeable battery 432 can pass through a switching mode voltage regulator 434 before being supplied to the switching circuit 450. The switching circuit 450 can use low impedance priority MOSFET technology to optimally regulate the power supplied to a rechargeable electrical energy storage unit 452. This electrical storage unit 452 could any combination of capacitor(s), supercapacitor(s), hybrid capacitor(s), rechargeable battery(s), and/or pulse capacitor(s) capable of being understood by anyone skilled in the art. The electrical storage unit 452 output could be controlled by voltage regulator(s) and/or supervisor(s) 454 before being supplied as freight electronic tracking unit power 456.

Figure 8:
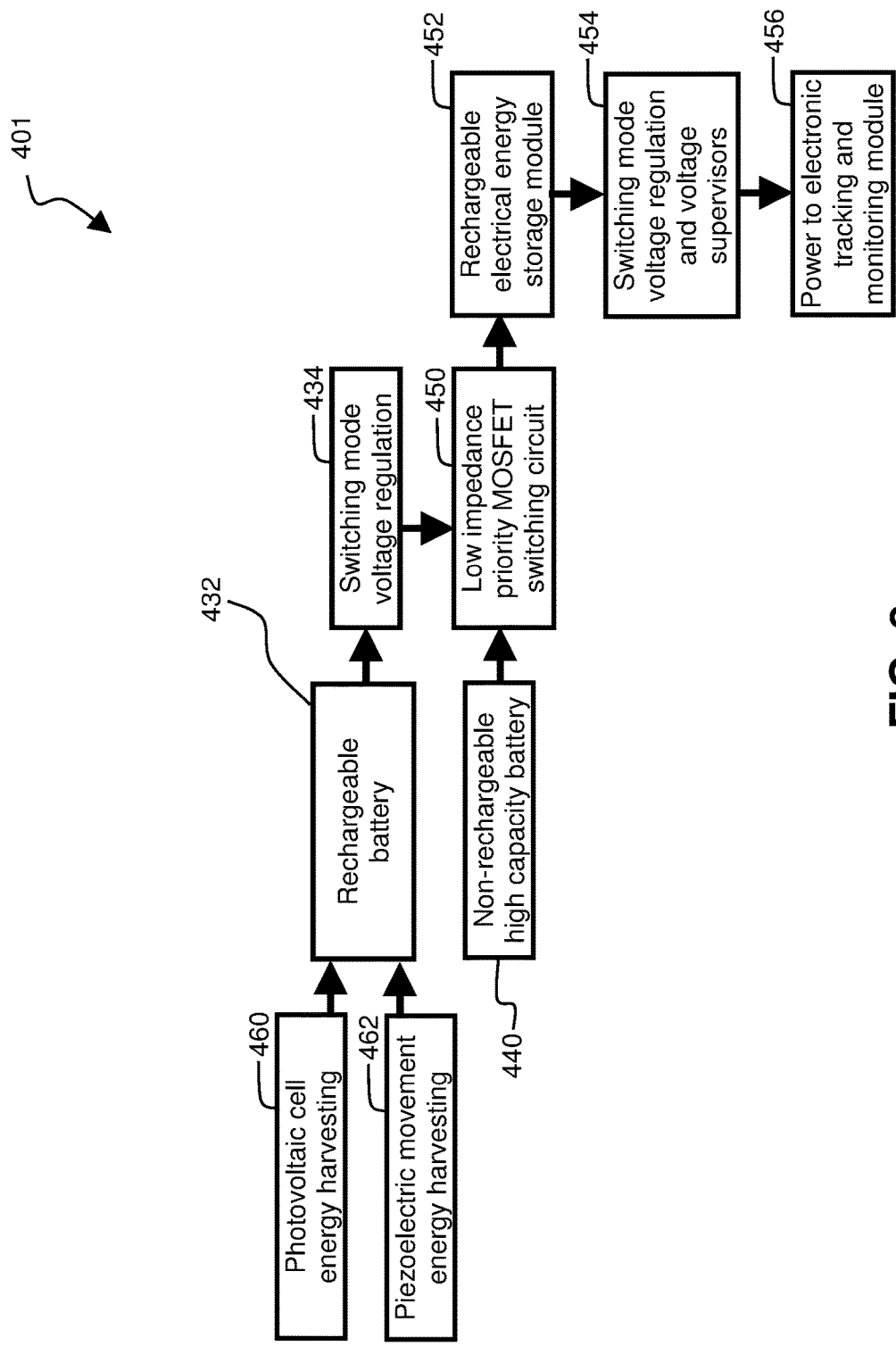
FIG. 8 shows a block diagram of an alternate power module for the tracking devices of FIG. 1 through FIG. 5.

FIG. 8 illustrates an alternative embodiment of an electrical power circuit 401 that can be used with embodiments of the present invention. The alternative embodiment electrical power circuit 401 shown in FIG. 8 is configured for situations in which external electrical power is not available. The alternative embodiment 401 shown in FIG. 8 and the embodiment 400 shown in FIG. 7 both use the non-rechargeable battery 440, the rechargeable battery 432, the switching mode voltage regulator 434, the low impedance priority MOSFET switching circuit 450, the rechargeable electrical energy storage unit 452, and the switching mode voltage regulation and voltage supervisors 454 in the same way to power the electronic tracking and monitoring module 456. Because external electrical power is not available in the alternate embodiment, 401 shown in FIG. 8, this embodiment 401 is configured to harvest electrical energy using a photovoltaic cell 460 and/or a piezoelectrical movement element 462. The piezoelectrical movement element 462 can use the movement of a mass or a pendulum to generate electrical power from the displacement of the mass or pendulum as a result of movement of the device. Such movement could be a vibration, which would result in the ability to harvest vibrational energy.

Figures 9A, 9B:
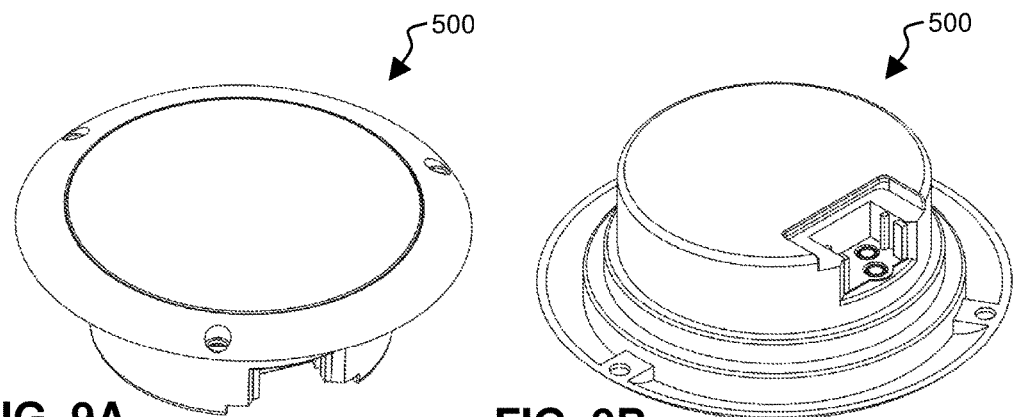
FIG. 9A is an isometric top view of a tail light shown in FIG. 1 and FIG. 3.
FIG. 9B is an isometric bottom view of the tail light of FIG. 9A.
Figure 9C:
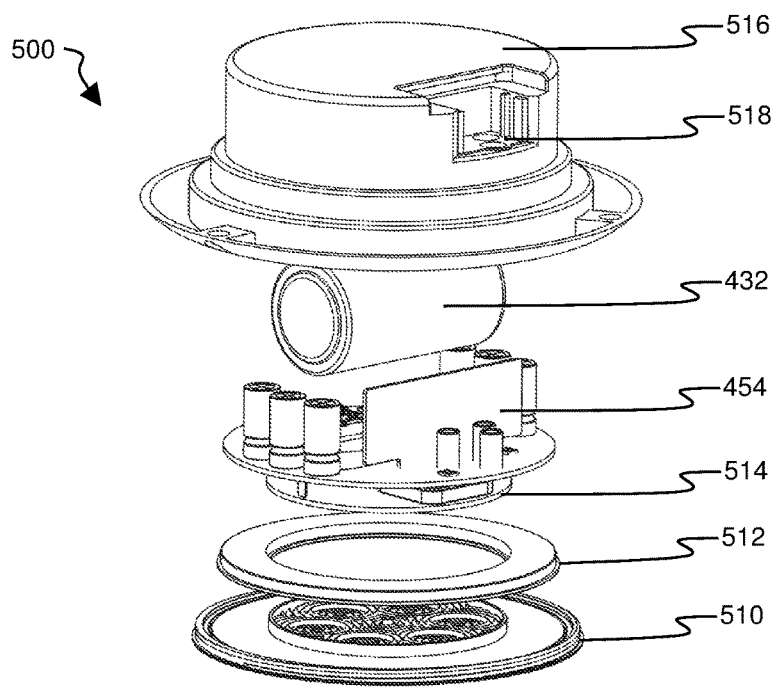
FIG. 9C is an exploded view of the tail light of FIG. 9A and FIG. 9B.

FIG. 9A, FIG. 9B, and FIG. 9C show a tail light 500 that can be used for electronic tracking and monitoring of movable freight containers. FIG. 9A shows an isometric top view of the electronic tail light 500. FIG. 9B, shows an isometric bottom view of the tail light 500. FIG. 9C shows an exploded view of the tail light 500. Referring to FIG. 9C, the electronic tracking tail light 500 comprises an external lens 510, an internal lens and/or diffuser 512, an electronic circuit and antennas 514, the rechargeable electrical energy storage unit 454 and rechargeable battery 432 that were also discussed with reference to FIG. 4, a back cover 516, and a standard light connector 518. The standard light connector 518 is used to get the power from the vehicle, 410 in FIG. 7.

Further referring to FIG. 9C, the electronic circuit and antennas 514 comprises the circuit elements that were shown with reference to FIG. 5. The electronic circuit and antennas 514 also comprises the voltage and/or current protection circuit 412, the vehicle lights 420, the light monitoring circuit 422, the closed loop battery charger 430, the switching mode voltage regulation 434, the non-rechargeable high capacity battery 440, the low impedance priority MOSFET switching circuit, and the switching mode voltage regulation and voltage supervisors 454 that were shown with reference to FIG. 7.

Figure 10A:
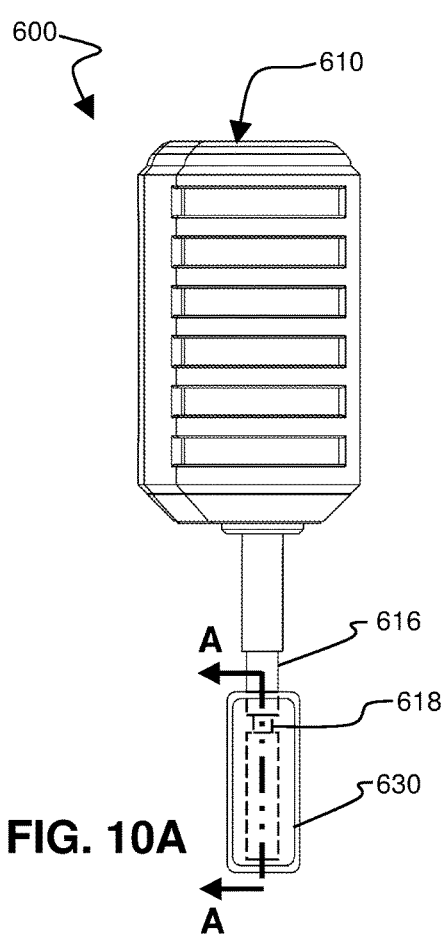
FIG. 10A is a side view of the lock shown in FIG. 2, FIG. 4, and FIG. 6 showing a mechanical lock module attached to an electronic module.
Figure 10B:
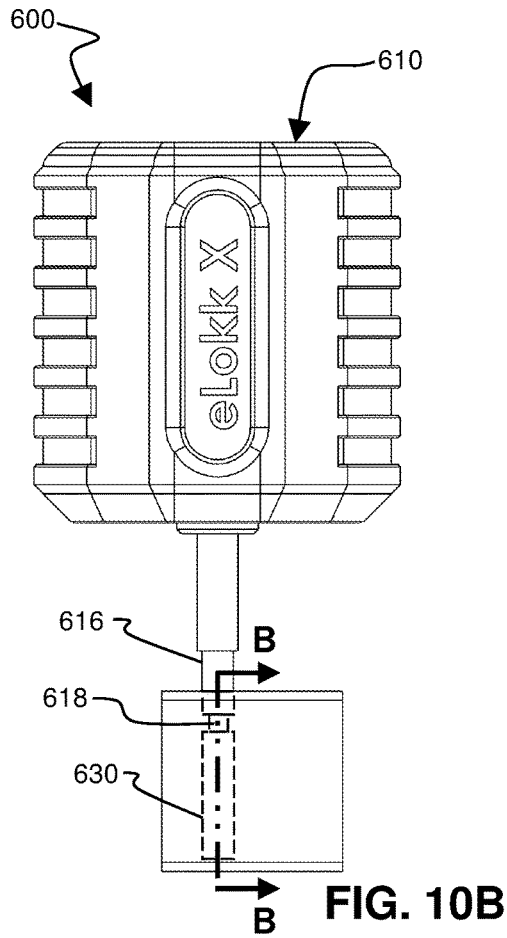
FIG. 10B is a front view of the lock of FIG. 10A.
Figure 10C:
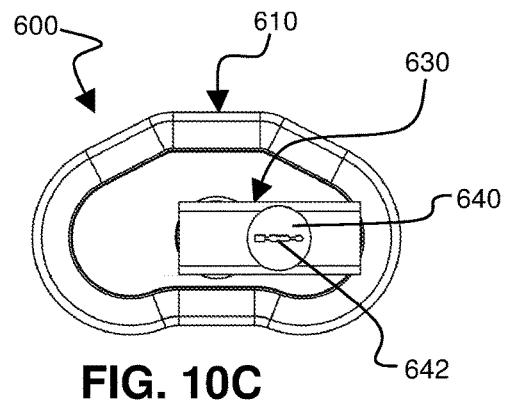
FIG. 10C is a bottom view of the lock of FIG. 10B.
Figure 11:
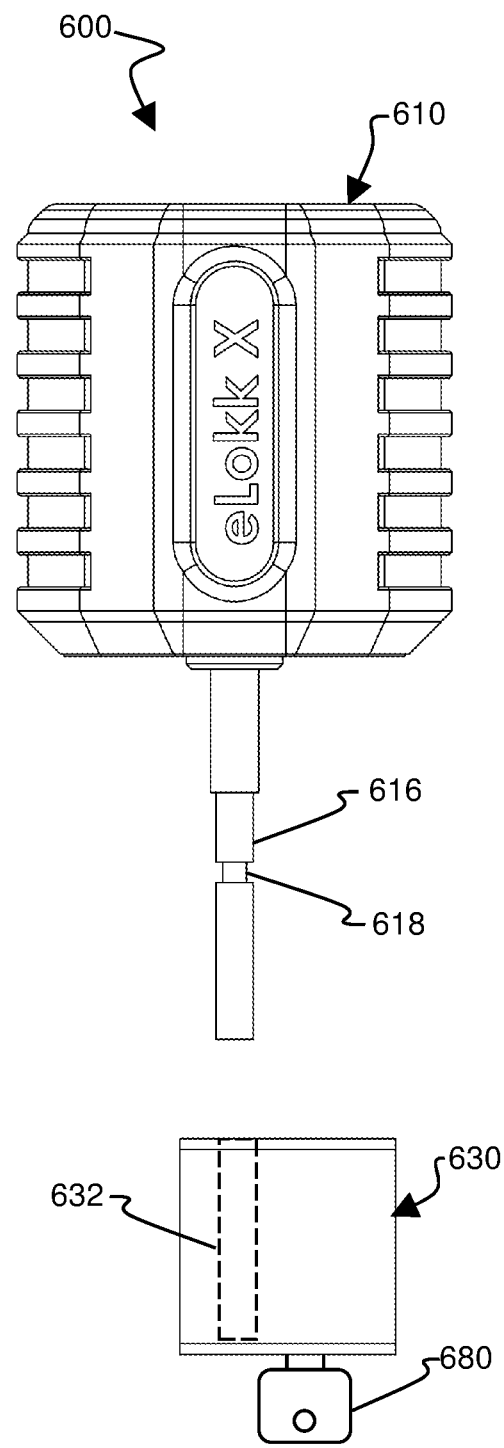
FIG. 11 is an exploded view of FIG. 10B with the mechanical lock module detached from the electronic module and a key inserted into the mechanical lock module.

FIG. 10A, FIG. 10B, and FIG. 10C show three orthogonal views of an electronic tracking and monitoring lock 600 for movable freight containers. This electronic tracking and monitoring lock 600 was previously shown in FIG. 2 (at 600A, 600B, 600C, and 600D), in FIG. 4 and in FIG. 6 (at 600A, 600B, 600C, 600D, and 600E). FIG. 10A is a side view. FIG. 10B is a front view. FIG. 10C is a bottom view. FIG. 11 is an exploded front view of the lock 600. Referring to FIG. 10A, FIG. 10B, FIG. 10C, and FIG. 11, the lock 600 comprises an electronic module, shown at 610, and a mechanical lock module, shown at 630. FIG. 11 shows a mechanical key 680 inserted in the mechanical lock module 630. This mechanical key 680 can be part of the system and method used to secure the mechanical lock module 630 to the electronic module 610, as well as allowing the mechanical lock module 630 to be user attached to and detached from the electronic module 610. FIG. 10C shows a keyhole 642 into which the mechanical key 680 could be inserted to rotate a cylindrical plug 640 and move elements of the mechanical lock module 630 from a locked position to an unlocked position, and vice versa. It should be understood that the mechanical lock module 630 could be any type of a lock module capable of being understood by anyone skilled in the art, including but not limited to:

(a) A mechanical lock module that uses a mechanical key;
(b) A mechanical lock module that uses a combination lock; and
(c) A mechanical lock module that uses a key and/or a combination lock in combination with another locking method such as an electromagnetic actuator, and/or an electronic sensor/transducer.

FIG. 10A, FIG. 10B, and FIG. 11 show that the electronic module 610 comprises an electronic lock module shaft, shown at 616. A portion of the shaft 616 is inserted into a cavity 632 in the mechanical lock module 630 when the lock 600 is in locked configuration (the configuration shown in FIG. 10A and FIG. 10B). The electronic module shaft 616 is fully removed from the mechanical lock module 630 when the lock 600 is in an unlocked configuration (a configuration shown in FIG. 11). The electronic module shaft 616 comprises a retaining feature, shown at 618. The electronic module shaft retaining feature 618 is used to secure the shaft 616 into the mechanical lock module 630 when the lock 600 is in a locked configuration. The electronic module shaft 616 can be any shape capable of being understood by anyone skilled in the art, including but not limited to a cylindrical shape, a rectangular shape, a hexagonal extruded shape, and an octagonal extruded shape. The retaining feature 618 can be any mechanical feature for retaining a mechanical assembly onto a shaft capable of being understood by anyone skilled in the art, including but not limited to a circular groove in a cylindrical shaft, a groove in a rectangular, hexagonal, or octagonal shaft, a notch, and a protrusion. The electronic module shaft 616 can be made of any material capable of being understood by anyone skilled in the art including, but not limited to various alloys of steel, aluminum, titanium, and ceramics. In one embodiment, the shaft comprises a non-magnetic hollow stainless-steel cylinder. The electronic module shaft 616 can also undergo a heat treatment or case-hardening process to improve the ability for the lock to be broken or cut.

FIG. 12A shows an exploded isometric view of the electronic module 610 shown previously. In the embodiment shown in FIG. 12A, the electronic module shaft 616, is securely attached to an electronic module case bottom 614. An electronic module main shell 612 attaches to the electronic module case bottom and houses the batteries 432 and 440 that were previously described with reference to FIG. 8. The electronic module 610 comprises one or more circuit boards, shown at 620 and 622, that hold the circuitry that was described with reference to FIG. 5 and FIG. 8. In the embodiment shown in FIG. 12A, the first circuit board 620, second circuit board 622, non-rechargeable high capacity battery 440, and rechargeable battery 432 are held within the volume that is inside the assembled electronic module case bottom 614, electronic module main shell 612, and an electronic module top cover 624. The electronic module case bottom 614, electronic module main shell 612, and electronic module top cover 624 could be made of any material capable of being understood by anyone skilled in the art including metals and plastics. There can be an electronic module rubber sleeve 626 around the outside of the electronic module main shell 612.

FIG. 12B is an isometric view of the mechanical lock module 630 that was shown previously. This drawing illustrates that in one embodiment, the mechanical lock module comprises a mechanical lock module case, shown at 634, and a set screw, shown at 638. The mechanical lock module case 634 is shown by itself in FIG. 12C. FIG. 12D gives an outline view the of the mechanical lock body internal parts 636 that are held inside the mechanical lock body case 634 when the case has been slid over the internal parts 636 and the set screw 638 has been fasted to prevent the case from sliding relative to the internal parts 636. The mechanical lock module case 634 is typically made of a hardened steel material to ensure that the lock module 630 cannot easily be broken by impact or other means used to physically destroy a lock.

Further referring to FIG. 12B, FIG. 12C, and FIG. 12D, the mechanical lock module cavity 632 comprises an aperture 632A in the top of the mechanical lock body case and a cavity 632B in the mechanical lock body internal parts. When the electronic module shaft (616 in FIG. 10A, FIG. 10B, FIG. 11, and FIG. 12A) is inserted through the mechanical lock body case aperture 632A at least far enough so that a portion of the shaft 616 is inside the cavity 632B in the mechanical lock body internal parts 636, the shaft 616 will also prevent the case 634 from sliding relative to the mechanical lock body internal parts 636.

Figure 13A:
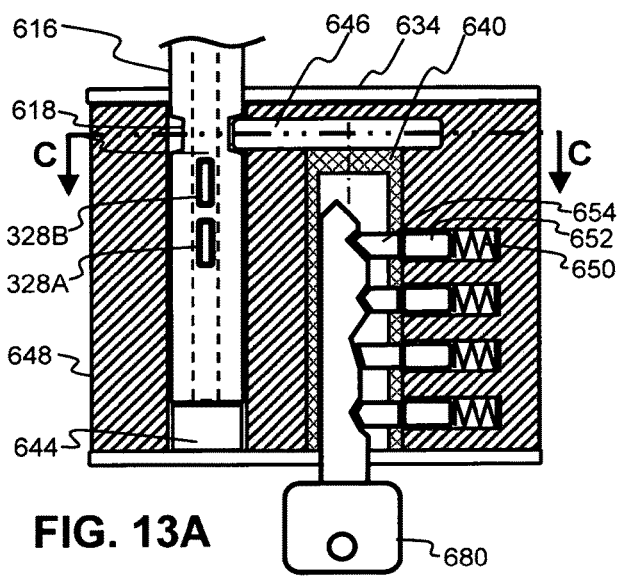
FIG. 13A shows Section A-A of FIG. 10A.
Figure 13B:
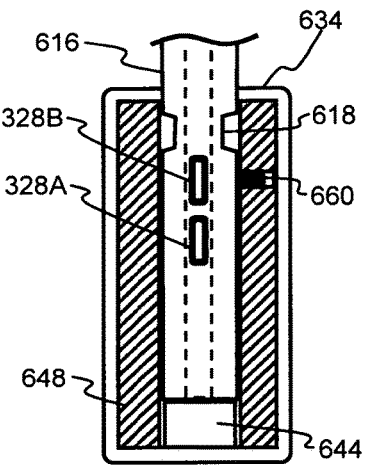
FIG. 13B shows Section B-B of FIG. 10B.
Figure 13C:
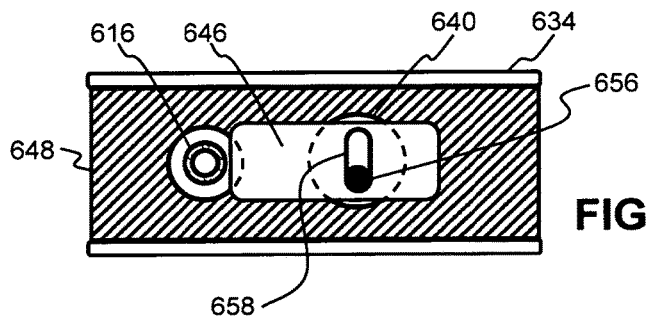
FIG. 13C shows Section C-C of FIG. 13A.

FIG. 13A shows Section A-A of FIG. 10A and FIG. 13B shows Section B-B of FIG. 10B. FIG. 13C shows Section C-C of FIG. 13A. These three drawings help illustrate and describe the functionality of the mechanical lock module 630 in FIG. 10A and FIG. 10B and the interactions of the mechanical lock module 630 with the mechanical key 680 and electronic module shaft 616. In FIG. 13A, FIG. 13B, and FIG. 13C, a portion of the electronic module shaft 616 is held in the cavity (632 in FIG. 11 and FIG. 12B) of the mechanical lock module (630 in FIG. 11 and FIG. 12B). In one embodiment, the main components of the mechanical lock module 630 are held by a mechanical lock module frame 648, which is held inside of the mechanical lock module case 634 by a set screw. The use of a set screw to secure the mechanical module case was described with reference to FIG. 12B. The electronic module shaft 616 is secured inside the cavity 632 by a locking plate, shown at 646 in FIG. 13A and FIG. 13C, because the locking plate 646 engages with the shaft retaining feature, shown at 618 in FIG. 13A. In the embodiment shown, the retaining feature 618 is a circular groove in the hollow cylindrical shaft 616. The locking plate 646 can be moved right and left in the view shown in FIG. 13A and FIG. 13B by using the mechanical key 680 to rotate the cylindrical plug, shown at 640. In the embodiment shown in FIG. 13A and FIG. 13C, the cylindrical plug 640 is a cylindrical assembly that can be rotated about a vertical axis and the cylindrical plug 640 comprises a locking plate engagement pin, shown at 656 in FIG. 13C that is located at the top of the cylindrical plug 640. The locking plate engagement pin 656 engages with a slot 658 in the locking plate 646 to move the locking plate 646 right and left in the view shown in FIG. 13A, which causes a portion of the locking plate 646 to move into and out of the shaft retaining feature region and lock and unlock the shaft 616. For embodiments of the present invention, the mechanism used to secure and release the shaft 616 inside the mechanical lock module 630 is not limited to the example shown here. The mechanism used to secure and release the shaft 616 inside the mechanical lock module 630 can be any mechanism capable of being understood by a person skilled in the art of designing mechanical locks.

FIG. 13A shows a tumbler lock mechanism in which the cylindrical plug 640 can only rotate if a mechanical key 680 is inserted into the cylindrical plug 640 and the mechanical key 680 has the correct profile for a plurality of key pins, shown at 654, each of which is pushed by a spring 650 and a driver pin 652, to align to the correct depths. If this alignment is correct, the cylindrical plug 640 can be rotated by the mechanical key 680 which causes the locking plate eccentric pin 656 in FIG. 13C to rotate, which causes a linear movement of the locking plate 646. When the electronic module shaft 616 is not secured by the locking plate 646, the shaft 616 can be removed from the mechanical lock module, 630 in FIG. 11 and FIG. 12B. When the mechanical lock module 630 is unlocked and the shaft 616 is inserted, the maximum depth of insertion can be set by using a stop pin, shown at 644 in FIG. 13A and FIG. 13B. The use of a stop pin 644 facilitates the use of a standard mechanical lock module 630 with a shaft 616 having its retaining feature 618 at a specific distance from the end of the shaft 616.

FIG. 13A and FIG. 13B also illustrate the location of magnetic field sensors, shown at 328A and 328B inside electronic module shaft 616. These magnetic field sensors 328 were previously described with reference to the system diagram shown in FIG. 5. The magnetic field sensors 328A and 328B are electrically coupled with the circuit boards shown at 620 and 622 in FIG. 12A. When the magnetic field sensors 328A and 328B are proximate to a magnet, such as the lock module magnet 660 shown in FIG. 13A, a signal is generated which can be interpreted by an electronic processing module in the system and used to determine the position of the shaft 616 in the mechanical lock module 630. The lock module magnet 660 shown in FIG. 13B is mounted in the mechanical lock module frame 648 in an orientation in which one of the poles of the lock module magnet 600 will align with the upper magnetic field sensor 328B when the electronic module shaft 616 is fully inserted into the mechanical lock module 630. The lock module magnet 660 aligns with the lower magnetic field sensor when the shaft 616 is partially inserted into the mechanical lock module.

The magnetic field sensors 328 used in embodiments of this invention can be any type of magnetic field sensors capable of being understood by anyone skilled in the art, including but not limited to:
(a) Magnetically-actuated reed switches;
(b) Hall effect sensors;
(c) Electro-magnetic coils; and
(d) Magneto-resistive sensors, which can include ordinary magnetoresistance (OMR) sensors, anisotropic magnetoresistance (AMR) sensors, tunneling magnetoresistance (TMR) sensors, spin Hall magnetoresistance (SMR) sensors, giant magnetoresistance (GMR) sensors, colossal magnetoresistance (CMR) sensors, Hanle magnetoresistance (HMR) sensors, and non-local magnetoresistance (NMR) sensors.

The magnetic field sensors 328 can be used to generate an analog (continuously varying) signal or a digital (on/off or switch closed/switch open) signal. In one embodiment, the magnetic field sensors are magnet Reed switches that are off when no magnetic field is present and on when a magnetic field is present. Such magnetic Reed switches have the benefit of being a proven technology that is reliable and available for a low cost.

Figure 13D:
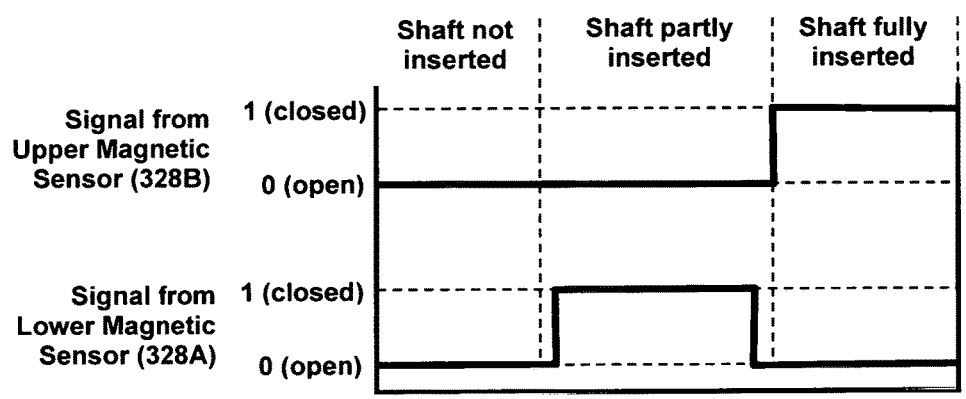
FIG. 13D is an example of an output signal generated by the magnetic field sensors shown in FIG. 13A and FIG. 13B as these sensors pass by the magnet shown in FIG. 13B during the insertion of a portion of the electronic module shaft into the mechanical lock module cavity.

FIG. 13D is an example of an output signal generated by the magnetic field sensors, 328A and 328B shown in FIG. 13A and FIG. 13B, as these magnetic field sensors pass by the mechanical lock module magnet, 660 shown in FIG. 13B, as the portion of the electronic module shaft, 616 in FIG. 13A and FIG. 13B, is inserted into the mechanical lock module cavity, 632 in FIG. 12B. The top graph section of FIG. 13D shows the signal generated by the upper magnetic sensor, 328B in FIG. 13A and FIG. 13B, as a function of shaft insertion depth and the bottom graph section of FIG. 13D shows the signal generated by the lower magnetic sensor, 328A in FIG. 13A and FIG. 13B as a function of shaft insertion depth. The output shown in FIG. 13D is a typical output from magnetic field sensors that are magnetic Reed switches. The following is a state table relating shaft insertion position to the outputs of the two magnetic sensors:

| Signal from Lower Magnetic Sensor (328A) | Signal from Upper Magnetic Sensor (328B) | System State |
|---|---|---|
| Low (no magnetic field detected) | Low (no magnetic field detected) | Shaft not inserted into mechanical lock module |
| High (magnetic field detected) | Low (no magnet field detected) | Shaft partly inserted into mechanical lock module |
| Low (no magnet detected) | High (magnetic field detected) | Shaft fully inserted into mechanical lock module |
| High (magnetic field detected) | High (magnetic field detected) | Error. There is something not correct about the system |

The above state table illustrates how the magnetic field sensors, 328A and 328B, and lock module magnet 660 can be used in embodiments of the present invention to monitor the locking process and unlocking processes as well as continuously monitoring that the lock system is operating correctly. During the locking process, the lower magnetic sensor must go from low to high and back to low. The first time when the lower magnetic sensor is low, the upper magnetic sensor must also be low. The second time when the lower magnetic sensor is low, the upper magnetic sensor must be high. When the system is locked, the lower magnetic sensor must always be low and the upper magnetic sensor must always be high. During the unlocking process, the lower magnetic sensor must go from low to high and back to low. The upper magnetic sensor must be high when the unlocking process is initiated and the lower magnetic sensor is low. The upper magnetic sensor must be low when the lower magnetic sensor goes low and the unlocking process is complete. If any of these sequences are not followed, or if at any time, both magnetic sensors go high, an alarm can be set and communicated.

The use of a minimum of one lock module magnet 660 and a minimum of two magnetic field sensors, 328A and 328B, in the configuration shown in FIG. 13A, FIG. 13B, and FIG. 13C and connected to a processor a wireless communication system, as described with reference to FIG. 5 creates a system that cannot be broken into by mounting a powerful magnet outside of the lock system to fool a magnetic field sensor 628 into detecting a magnetic field normally associated with a lock module magnet 660 when the mechanical lock module 630 has been removed from the electronic module shaft 616. Another key feature of the system illustrated in this disclosure is that the mechanical lock module is a totally passive module. It has no electronics in it. All active electronic components are in the electronic module 610.

FIG. 14A, FIG. 14B, and FIG. 14C schematically show three positions for the electronic module relative to the mechanical lock module. FIG. 14A is an end schematic view of the electronic module 610 and the mechanical lock module 630 where the electronic module shaft 616 is not inserted into the mechanical lock module 630. This is the state when both the upper magnetic field sensor 328B and the lower magnetic field sensor 328B do not detect the lock module magnet 660 (i.e. the left region of the graph in FIG. 13D). FIG. 14B is an end schematic view of the electronic module 610 and the mechanical lock module 630 where the electronic module shaft 616 is partly inserted into the mechanical lock module 630 in a position where the lower magnetic field sensor 328A detects the lock module magnet 660 and the upper magnetic field sensor 328A does not detect the lock module magnet 660 (i.e. the center region of the graph in FIG. 13D). FIG. 14C is an end schematic view of the electronic module 610 and the mechanical lock module 630 where the electronic module shaft 616 is fully inserted into the mechanical lock module 630 in a position where the lower magnetic field sensor 328A does not detect the lock module magnet 660 and the upper magnetic field sensor 328A does detect the lock module magnet 660 (i.e. the right region of the graph in FIG. 13D).

Additional magnets and sensors can be added to the lock system to make it even more secure and tamper-proof. By placing the magnets at different positions, it is also possible to ensure that a specific electronic module must be mated with a specific mechanical lock module. For example, the system shown in FIG. 15A, FIG. 15B, FIG. 15C, and FIG. 15D comprises three lock module magnets 660A, 660B, and 660C that are located at different positions in an alternate embodiment lock module 631A so that the magnets 660A, 660B, and 660C, will be detected by magnetic field sensors at different insertion positions for the electronic module shaft 616. The alternate embodiment electronic module 611A shown in FIG. 15A, FIG. 15B, FIG. 15C, and FIG. 15D has four magnetic field sensors 328A, 328B, 328C, and 328D that are located at various positions inside the length of the shaft 616. FIG. 15A is an end schematic view of this alternate embodiment mechanical lock module 631A having three magnets, 660A, 660B, and 660C and the alternate embodiment electronic module 611A having four magnetic field sensors, 628A, 628B, 628C, and 628D with the shaft 616 not inserted into the lock module 631A. FIG. 15B shows the alternate embodiment lock module 631A and the alternate embodiment electronic module 611A of FIG. 15A with the shaft 616 partly inserted into lock module 631A at a position where the top magnet 660A is detected by the bottom magnetic field sensor 328A in the shaft 616. FIG. 15C shows the lock module 631A and electronic module 611A of FIG. 15A with the shaft 616 inserted into lock module 631A at a position where the top magnet 660A is detected by the second from the top magnetic field sensor 328C. FIG. 15D shows the lock module 631A and electronic module 611A of FIG. 15A when the shaft is fully inserted.

The magnets can have different field strengths and the sensors can be analog magnetic field sensors to make the lock system even more secure and tamper-proof. For example, FIG. 16A, FIG. 16B, FIG. 16C, FIG. 16D, and FIG. 16E illustrate a second alternate embodiment locking system in which there are four analog magnetic field sensors that can detect magnetic field strength, 628A, 628B, 628C, and 628D and four alternate lock module magnets 661A, 661B, 661C, and 661D, that have differing magnetic field strengths, as indicated by the diameters of the circles for these magnets. The systems shown in FIG. 16A, FIG. 16B, FIG. 16C, and FIG. 16D is configured to convert these different magnetic fields strengths to analog electrical values. In FIG. 16A, this system is illustrated with the shaft 616 of the second alternate embodiment electronic module 611B not inserted into the second alternate embodiment lock module 631B. In FIG. 16B, this system is illustrated with the shaft 616 inserted so that the bottom sensor can read the top magnet. In FIG. 16C, this system is illustrated with the shaft inserted so that the second from the top sensor can read the top magnet. In FIG. 16D, this system is illustrated with the shaft fully inserted.

FIG. 16E shows a graph of the magnetic field strength of the four alternate lock module magnets 661A, 661B, 661C, and 661D of FIG. 16D as these magnetic field strengths are detected by the four sensors, 628A, 628B, 628C, and 628C when the shaft 616 of the second alternate embodiment electronic module 611B is inside the second alternate embodiment lock module in the position shown in FIG. 16D. It can be appreciated from this graph that the profile being read by the four analog magnetic field sensors looks analogous to the profile on a typical key used in a lock. This illustrates that the use of multiple magnets with multiple field strengths in conjunction with multiple magnetic field sensors capable of reading analog values can be used to "key" the mechanical lock modules to specific electronic modules.

One way of summarizing some of the functionality and of the magnet(s) and sensors systems illustrated in FIG. 13A through FIG. 16E is as follows:

The electronic module 610 comprises a shaft 616 made of a non-magnetic material, typically stainless steel;

The electronic module shaft 616 is hollow, so a plurality of magnetic field sensors 328 can be placed into the center of the shaft at various points along the length of the shaft;

The mechanical lock module 630 comprises at least one magnet 660;

When the shaft 616 is inserted into the mechanical lock module 630, each magnetic field sensor will detect the magnet (or each magnet) at specific positions of insertion of the shaft 616 into a cavity 632 of the mechanical lock module 630;

The signals from the magnetic field sensors can be used to determine a variety of conditions related to the lock system.

Among the conditions of the lock system that the magnetic field sensors can detect and wirelessly communicate can include:

(a) Interruptions in any of the signals indicating a fault with any part of the system;

(b) A condition indicative of an attempt to fool the lock; and (c) An incorrect combination of an electronic module 610 and mechanical lock module 630.

Figure 17:
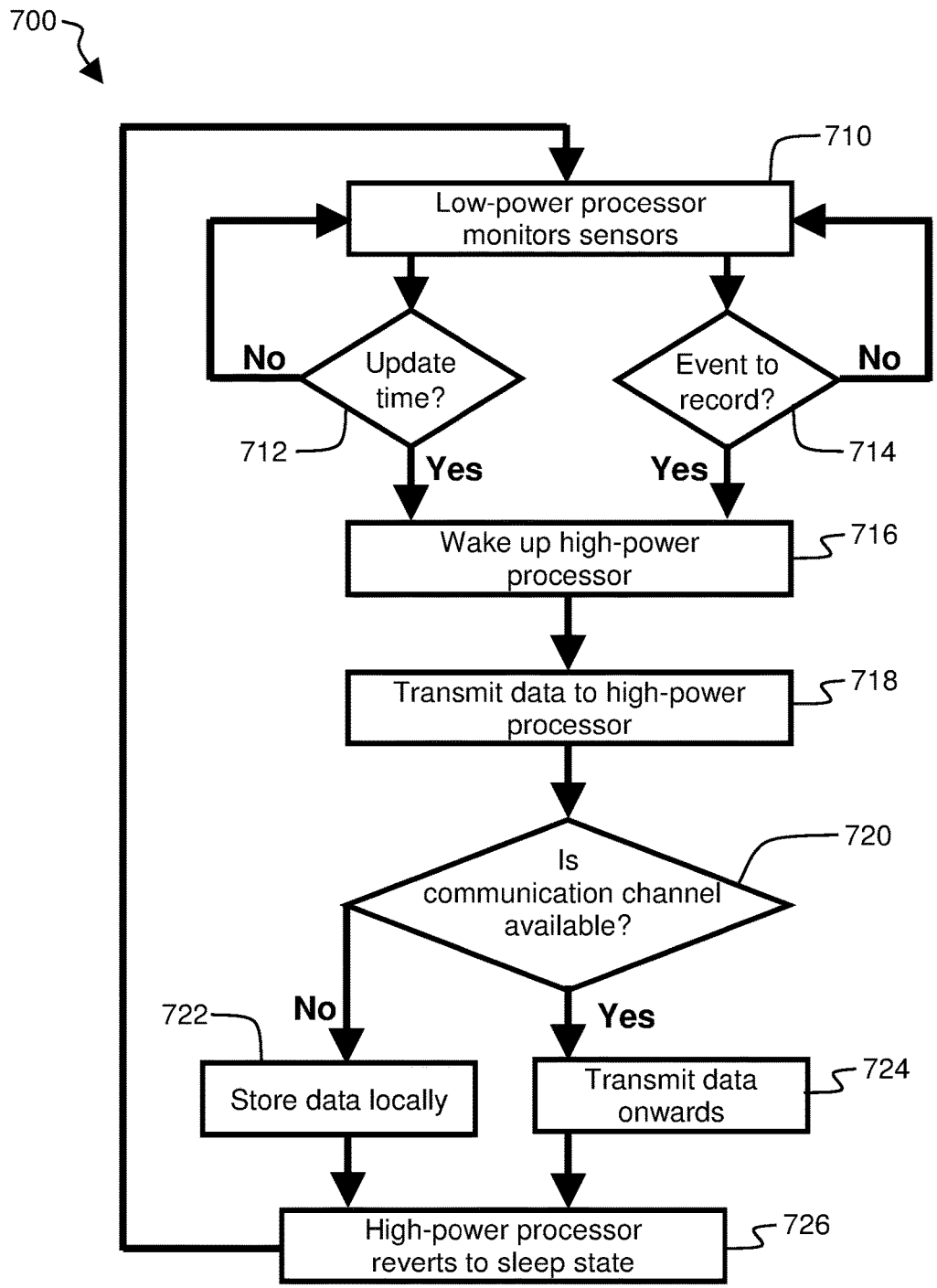
FIG. 17 is a process flow chart for how a low power processor and high power processor that can be used to minimize energy consumption for an electronic tracking device.

FIG. 17 shows a process for using a low power processor to minimize energy consumption for an electronic tracking device 700. The power minimization process uses a low power processor to monitor sensors as shown at 710. As long as a pre-determined update time is not reached, as shown at 712, or an event occurs that needs to be recorded, as shown at 712, the high-power processor stays asleep. When it is time to update the information 712 or there is an event to record, the high-power processor is woken up, as shown at 716. This allows data to be transmitted to the high-power processor, as shown at 718. Next, a decision needs to be made based on whether a communication channel is available, a step shown at 720. This communication channel could be a cellular communication channel, it could be an inter-device (e.g. mesh network communication channel as was described with reference to FIG. 6), it could be a WiFi communication channel, and/or it could be any other communication channel based on any other communication method or protocol described herein or capable of being understood by anyone skilled in the art. If no communication channel is available, data is stored locally, as shown at 722. If a communication channel is available, data is transmitted onwards, as shown at 724. Once data has either been stored locally 722 or transmitted onwards 724, the high-power processor can revert to a low power consuming sleep mode, as shown at 726.

In order to use "dead reckoning" to determine the position of a device when other positioning information is not available, the system must (a) start calculating from a known position, (b) use acceleration information as a function of time to determine velocity information as a function of time, and (c) use the velocity information as a function of time and the known position information to determine position information for the device as a function of time. This velocity information can come from the IMU. It can also be supplemented with velocity information from the vehicle. Since the acceleration information from the inertial measurement unit (IMU) can be noisy, it is important to try to use redundancy and noise filtering technologies to improve the accuracy of the system. Embodiments of the present invention can use a Kalman filter, a Madgwick filter, and/or a Mahony filter as well as redundant IMUs to help improve the accuracy of the position information calculated using "dead reckoning".

Fusion filters such as those attributed to Mahoney, Madgwick and Kalman, can use Euler angles or quaternions for coordinate transformations. The Euler angle representation is sometimes called a 3-2-1-rotation sequence of yaw (or heading), pitch, and roll. Using Euler angles, the position of a point in space can be determined using a spherical coordinate system. A spherical coordinate system permits the user to identify any point in space from two tilt angles and one radial distance. The tilt angles, pitch and roll, captured from an inertial sensor (such as an accelerometer, gyroscope, and/or magnetometer) can be used respectively as Alpha and Beta angles of the spherical coordinate system as illustrated in the equations below. Orientation can be captured by measuring the projection of the static gravity on a tilted accelerometer (or other type of inertial sensor). Radial distance R can be measured using a linear measurement from an accelerometer. Combining orientation and radius, the instantaneous position of an object in an inertial frame can be expressed as a function of the time-varying radius and spherical angles (Euler angle transformation).

$X = R(t) \cdot \text{Cos}(\alpha) \cdot \text{Sin}(\beta)$ $Y = R(t) \cdot \text{Sin}(\alpha) \cdot \text{Sin}(\beta)$ $Z = R(t) \cdot \text{Cos}(\beta)$ It is important to distinguish between the inertial frame and the user frames. The inertial frame is considered as a reference and all objects in the 3D virtual environment are expressed with respect to it. Thus, the inertial frame is fixed. The x-axis is pointing to any convenient direction, the z-axis is pointing vertically upward and the y-axis is perpendicular to both. The user frame is the moveable system containing the pointer. It is defined by a rotation around the z-axis by $\psi$ and by the rotation around x and y by $\theta$ and $\Phi$. Moreover, the distance between those frames defines the offset of the pointer with respect to the inertial frame. The figure below illustrates those rotations (Euler angle transformations). The matrix linking between those two frames is the product of the following rotation matrix.

$$R = e^{(\hat{z}\times)\psi} e^{(\hat{y}\times)\theta} e^{(\hat{x}\times)\phi} = \begin{bmatrix} \cos(\psi) & -\sin(\psi) & 0 \\ \sin(\psi) & \cos(\psi) & 0 \\ 0 & 0 & 1 \end{bmatrix} \cdot$$

$$\begin{bmatrix} \cos(\theta) & 0 & \sin(\theta) \\ 0 & 1 & 0 \\ -\sin(\theta) & 0 & \cos(\theta) \end{bmatrix} \cdot \begin{bmatrix} 1 & 0 & 0 \\ 0 & \cos(\varphi) & -\sin(\varphi) \\ 0 & \sin(\varphi) & \cos(\varphi) \end{bmatrix}$$

After developing we get:

$$R_{IB} = \begin{bmatrix} \cos(\psi) \cdot \cos(\theta) & \cos(\psi) \cdot \sin(\theta) \cdot \sin(\varphi) - \sin(\psi) \cdot \cos(\varphi) & \cos(\psi) \cdot \sin(\theta) \cdot \cos(\varphi) - \sin(\psi) \cdot \sin(\varphi) \\ \sin(\psi) \cdot \cos(\theta) & \sin(\psi) \cdot \sin(\theta) \cdot \sin(\varphi) - \cos(\psi) \cdot \cos(\varphi) & \sin(\psi) \cdot \sin(\theta) \cdot \cos(\varphi) - \cos(\psi) \cdot \sin(\varphi) \\ -\sin(\theta) & \cos(\theta) \cdot \sin(\varphi) & \cos(\theta) \cdot \cos(\varphi) \end{bmatrix}$$

In comparison, a quaternion is an abstract means for representing a change or reference frames as a four-dimensional vector to describe a three-dimensional change in orientation (or attitude). Although the Euler angle representations of attitude, is quite intuitive as a three-dimensional vector representing a three-dimensional attitude, it suffers from an inherent problem with its attitude representation. There are two attitudes (90 degrees and 270 degrees) where a singularity occurs in which case the yaw and the roll would perform the same operations. This "gimbal lock" issue could be quite problematic in the control of a body when dealing with angles close to the singularity points. A quaternion attitude representation can be used to provide a full description of an orientation without the need for handling the Euler angle singularities computationally. There are several other advantages to using a quaternion attitude representation over Euler angles. One of these advantages is that the use of quaternions is that no trigonometric functions need to be solved, as is the case when using Euler angles. Trigonometric functions are computationally expensive to solve and can slow down the control look. Small angle approximations can be used for orientation changes of less than 5 degrees, but this can create other issues. Quaternions require a single trigonometric calculation only when a non-zero yaw angle is included in the orientations. Otherwise, quaternion calculations are solely algebraic and computationally inexpensive. It is also simpler to smoothly interpolate between two orientations when using quaternions rather than Euler angles. However, converting a quaternion orientation into a usable pitch, roll, and yaw orientation does require an extra algebraic transformation that is not needed when using Euler angles.

Quaternions get around the "gimbal lock" problem by over defining an attitude representation through the addition of an additional degree not included when calculating Euler transformations. Like Euler angles, quaternions are based on Euler's concept that: "A rigid body or coordinate reference frame can be brought from an arbitrary initial orientation to an arbitrary final orientation by a single rigid body rotation through a principal angle Φ about the principal axis; the principal axis is a judicious axis fixed in both initial and final orientation." This principle means that any arbitrary orientation could be represented with just a unit vector and an angle where the unit vector (r) defines the direction of rotation and the angle (θ) being the amount of rotation about the direction's axis to reach a final attitude from an initial one. The quaternion approach is based upon this principle and can be derived from the principal axis (r) and principal angle (θ). A quaternion is a 4-dimensional hyper-complex number. The three complex parts, denoted as I, j, and k are interrelated by the following equations:

i2=j2=k2=1 ij=k=ji jk=i=kj ki=j=ik

While different papers on the subject use different ordering of the terms, all quaternions fundamentally represent the same thing. Hence, a quaternion could be used to represent the orientation of a rigid body or coordinate frame in three-dimensional space $$^A_B\hat{q} = [q_0 \; q_1 \; q_2 \; q_3] = \left[\cos\frac{\theta}{2} \; -r_x\sin\frac{\theta}{2} \; -r_y\sin\frac{\theta}{2} \; -r_z\sin\frac{\theta}{2}\right]$$

representation of the quaternion coordinate transformations in embodiments of the sensor signal filter systems shown in FIG. 18A, FIG. 18B, FIG. 19, FIG. 20A and FIG. 20B. The following equation describes a quaternion-based transformation where $^A_B\hat{q}$ is a quaternion representing the coordinate transformation and $^A_B\hat{q}$ is defined by the following equation: Where:
- $q_0$ is the scalar component of the quaternion and $q_1$, $q_2$, and $q_3$ represent the vector components of the quaternion. Note that quaternions can be written as a vector with 4-scalar components ($q_0$, $q_1$, $q_2$, and $q_3$), with components $q_1$, $q_2$, and $q_3$ corresponding to the distance along the quaternion basis vectors of i, j, and k. The $q_0$ component is considered the scalar part of the quaternion and $q_1$, $q_2$, and $q_3$ together form the vector part. Hence, another representation of the quaternion in the complex domain is $^A_B\hat{q}=q_0+q_1 i+q_2 j+q_3 k$
- r is the axis of rotation in frame A and $r_x$, $r_y$, and $r_z$ are the axis components also the x, y and z axes
- θ is the angle of rotation around the axis r It is often useful to represent a quaternion rotation with an orthogonal matrix that, when post-multiplied by a column vector representing a point ins pace, results in the point rotated by the quaternion. This orthogonal matrix R is shown in the following equation:

$$^A_B R = \begin{bmatrix} 2q_0^2-1+2q_1^2 & 2(q_1 q_2+q_0 q_3) & 2(q_1 q_3-q_0 q_2) \\ 2(q_1 q_2-q_0 q_3) & 2q_0^2-1+2q_2^2 & 2(q_2 q_3+q_0 q_1) \\ 2(q_1 q_3+q_0 q_2) & 2(q_2 q_3-q_0 q_1) & 2q_0^2-1+2q_3^2 \end{bmatrix}$$

It is also useful to represent the Euler angles as a function of the quaternions. In an Euler angle representation of a transformation the ZYX Euler angles Φ, θ, and ψ, describe the orientation of frame B achieved by the sequential rotations from alignment with frame A, of ψ around the Z axis of Frame B, θ around the Y axis of Frame B, and Φ around the X axis of Frame B. Hence, the Euler angles can be calculated by the following equations using $$^A_B\hat{q} = [q_0 \; q_1 \; q_2 \; q_3] = \left[\cos\frac{\theta}{2} \; -r_x\sin\frac{\theta}{2} \; -r_y\sin\frac{\theta}{2} \; -r_z\sin\frac{\theta}{2}\right]$$

$$\phi = \operatorname{atan2}(2(q_2 q_3 - q_0 q_1), 2q_0^2 - 1 + 2q_3^2)$$

$$\theta = -\arctan\left(\frac{2(q_1 q_3 + q_0 q_2)}{\sqrt{1-(2q_1 q_3 + 2q_0 q_2)^2}}\right)$$

$$\psi = \operatorname{atan2}(2(q_1 q_2 - q_0 q_3), 2q_0^2 - 1 + 2q_1^2)$$

Figure 18A:
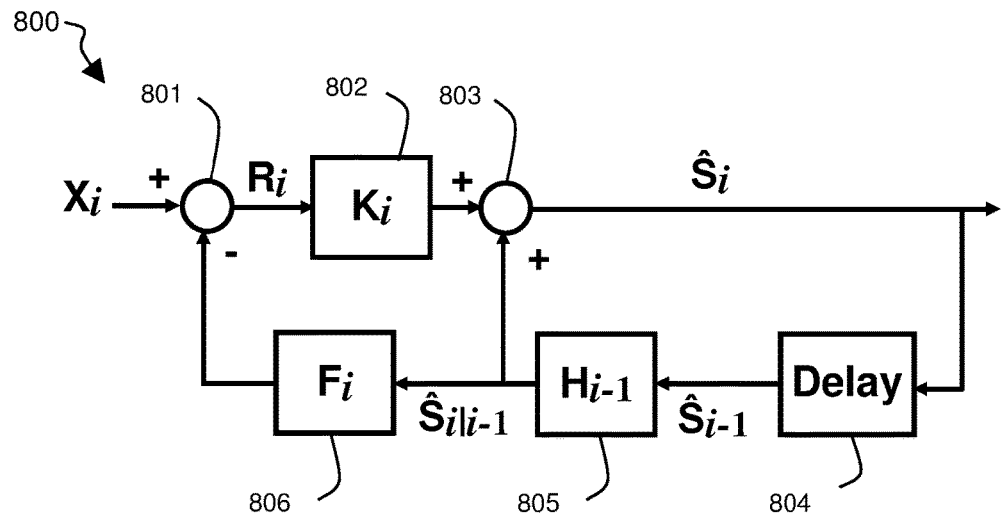
FIG. 18A shows a generalized Kalman filter.

FIG. 18A shows the main elements of a generalized Kalman filter, 800. A Kalman filter is a linear, unbiased, and minimum error variance recursive algorithm that optimally estimates the unknown state of a linear dynamic system from noisy data taken at discrete real-time intervals. Referring to FIG. 18A, the actual measurement Xi is compared with the predicted measurement from the prediction model 806, a step shown at 801. The measured difference between actual measurement Xi and the output from the prediction model 806 is called residual or innovation Ri. This residual Ri is multiplied by a Kalman filter gain in the step labeled 802. Step 802 can comprise a matrix multiplication. In the step labeled 803 the output of the Kalman gain computation is added to the system model output based on the previous estimate, a value shown as Ŝi|i+1. The result of the addition in step 803 is a new state estimate Ŝi. The new state estimate Ŝi is updated at discrete time intervals based on the length of the time interval delay 804. After this time delay, the most recent state estimate becomes Ŝi−1, and is called the previous state estimate. The previous state estimate Ŝi−1 is then fed through a system model 805 which results in a system model output based on the previous state estimate Ŝi|i−1. This system model transformation 805 can comprise a matrix multiplication. The system model output based on the previous estimate Ŝi|i−1 serves as the input for a prediction model transformation, shown at 806. The prediction model transformation 806 can also comprise a matrix multiplication. When using a Kalman filter for generating position and orientation information, coordinate transformations performed in the Kalman filter gain calculation 802, the system model transformation 805, and the prediction model transformation 806, can be performed using the Euler angle transformations or through the use of quaternions.

Figure 18B:
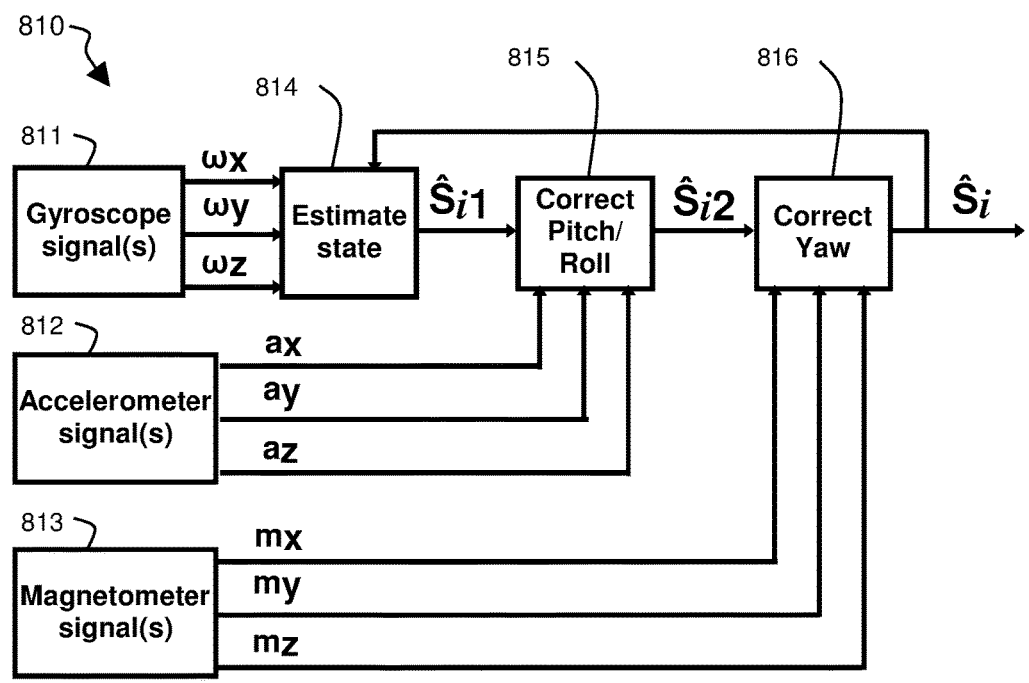
FIG. 18B shows an extended Kalman filter configured for use in an inertial measurement unit.

FIG. 18B shows the main elements of an extended Kalman filter 810 configured for use in an inertial measurement unit (IMU). In FIG. 18B there are three signals that come from a gyroscope 811 and used to estimate state 814, using a Kalman filter implementation similar to the generalized Kalman filter 800 shown in FIG. 18A. These three signals are labeled ωx, ωy, and ωz in FIG. 18B and represent the rate of change of rotation of the gyroscope about three mutually perpendicular (x, y, and z axes) in a Cartesian reference frame. The result of this first Kalman filter to estimate state 814, is a first state estimate Ŝi1. This first state estimate Ŝi1 can be combined with accelerometer orientation signals ax, ay, and az from the accelerometer 812. These three accelerometer orientation signals ax, ay, and az are rotation signals about the same three perpendicular axes as for the gyroscope. Combining ax, ay, and az with Ŝi1 in the second Kalman filter, shown at 815, results in a second state estimate Ŝi2, in which pitch and/or roll have been corrected. This second state estimate Ŝi2 can be combined with magnetometer orientation signals mx, my, and mz from the magnetometer 813. These three magnetometer orientation signals mx, my, and mz are rotation signals about the same three perpendicular axes as for the gyroscope and the accelerometer. Combining mx, my, and mz with Ŝi2 in the third Kalman filter, shown at 816, results in an output state estimate Ŝi, in which yaw has also been corrected. The resulting orientation state estimation can be made significantly more accurate using this extended Kalman filter and three different orientation signal inputs 811, 812, and 813, than a Kalman filter using only one input, as was illustrated in FIG. 18A.

Figure 19:
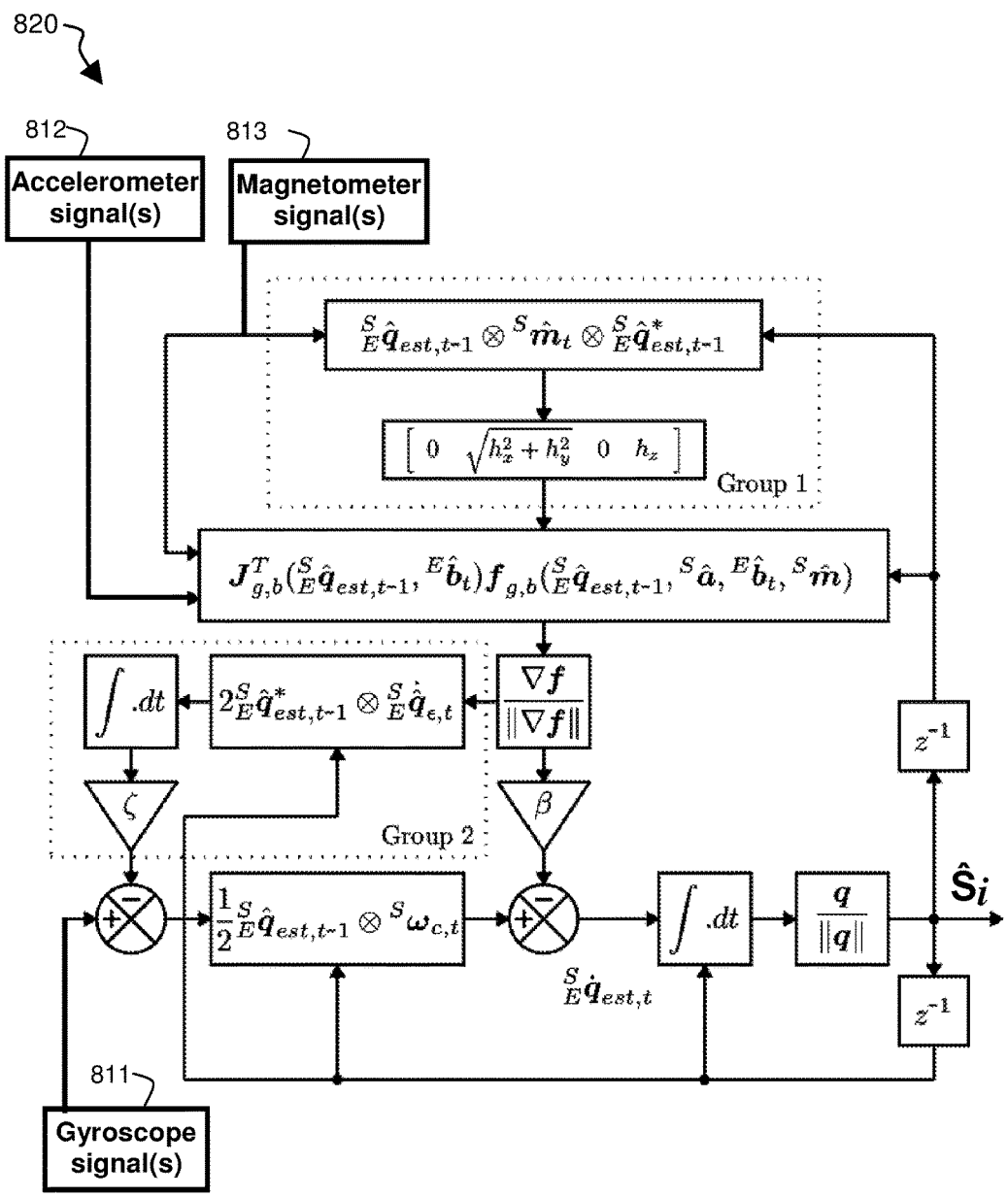
FIG. 19 shows a Madgwick filter using magnetometer, accelerometer, and gyroscope inputs (MAGI)

FIG. 19 shows the main elements of a Madgwick filter 820 used for an IMU. Referring to FIG. 19 the Madgwick filter 820 also uses orientation inputs from a gyroscope 811, a magnetometer 813, and an accelerometer 812 to generate the output state estimate Ŝi. The Madgwick filter calculates the orientation output Ŝi by numerically integrating the estimated orientation rates. The orientation output Ŝi is computed based on the rate of change of orientation measured by the gyroscope 811. The magnitude of the gyroscope measurement error is removed in the direction of the estimated error. This estimated error is computed from accelerometer measurements 812 and magnetometer measurements 813 using the equations shown in FIG. 19.

Figure 20A:
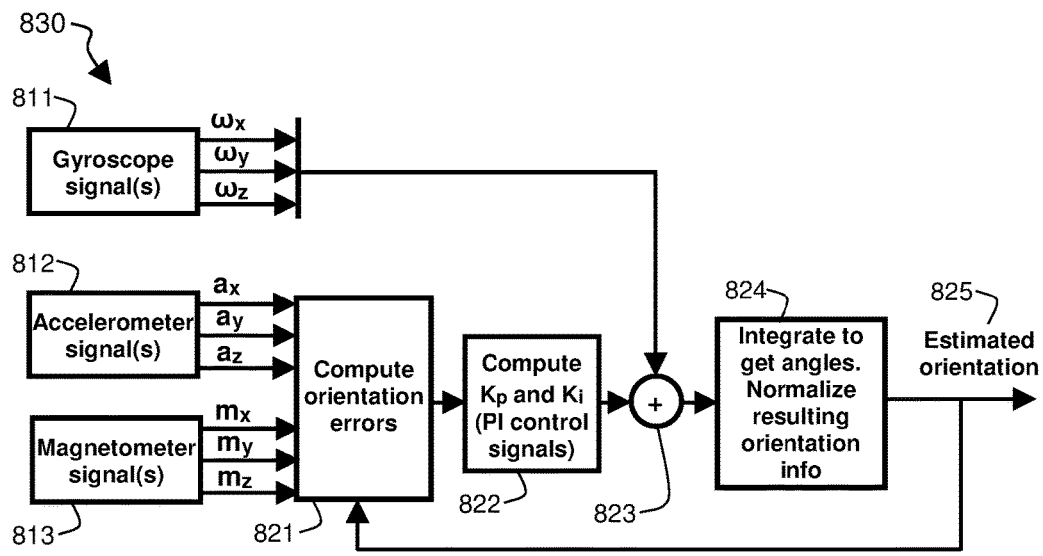
FIG. 20A and FIG. 20B show the main elements of a Mahony filter using magnetometer, accelerometer, and gyroscope inputs (MAGI).
Figure 20B:
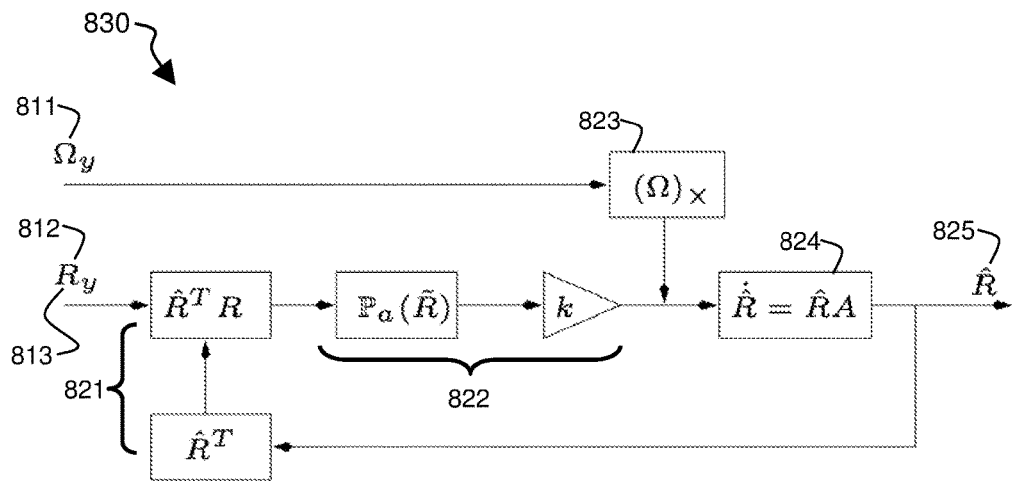

FIG. 20A and FIG. 20B show the main elements of a Mahony 830 filter. The Mahony filter is similar to the Madgwick filter 820 and can be implemented using Euler angles or quaternions. FIG. 20A provides an overview of one embodiment of a Mahony filter 820 using Euler angles x, y, and z from a gyroscope (ω, shown at 811), accelerometer (a, shown at 812) and magnetometer (m, shown at 813). These same signals are shown in FIG. 20B in a more generalized fashion as orientation matrices (which could be Euler angles or quaternions) from a gyroscope (Ω shown at 811) and an accelerometer and/or magnetometer (R, shown at 812/813). The first step of the process or system computes orientation errors by comparing the estimated orientation 825 with the signals for the orientation signals from the accelerometer 812 and/or magnetometer 813, a step shown at 821. These signals are then multiplied and integrated in in the step shown at 822. This multiplication and integration is the same as the P (proportional) and I (integral) steps in a PID (proportional integral derivative) controller. In the case of a Mahony filter, the derivative information (i.e. angular rate change information) is provided by the gyroscope signals 811 and added to the PI information in the adder shown at 823. The resulting information is integrated and normalized, as shown in step 824, to get an improved estimated orientation 825. This process is repeated as new gyroscope 811, accelerometer 812, and/or magnetometer 813 signals are received.

4. Additional Features and Fields of Use.

The systems and methods described herein can be used in a variety of applications, including but not limited to:
(a) Monitoring of freight containers in a rail yard;
(b) Monitoring of freight containers on a ship or at a dock;
(c) Monitoring of truck trailers;
(d) Monitoring of delivery trucks;
(e) Monitoring of sealed air cargo containers;
(f) Collecting and forwarding sensor data in a smart chassis configuration;
(g) Acting as a communications node in a yard or traffic environment;
(h) Providing situation awareness in trucks operating in an autonomous driving mode; and
(i) Providing cargo and route information for customs and border control.

A number of variations and modifications of the disclosed embodiments can also be used. While the principles of the disclosure have been described above in connection with specific apparatuses and methods, it is to be clearly understood that this description is made only by way of example and not as limitation on the scope of the disclosure.

What is claimed is:

1. A locking system wherein:
the system comprises an electronic module and a mechanical lock module;
the mechanical lock module comprises a cavity;
the electronic module comprises a shaft:
at least a portion of the electronic module shaft is configured for insertion into the mechanical lock module cavity;
the mechanical lock module comprises a lock mechanism configured for mechanical movement from an unlocked position to a locked position;
the electronic module shaft portion comprises a retaining feature configured for secure retention of the electronic module shaft by the lock mechanism when the electronic module shaft portion is inserted into the mechanical lock module cavity and the lock mechanism is in a locked position;
the mechanical lock module comprises a first magnet;
the electronic module comprises a first magnetic field sensor and a second magnetic field sensor;
the first magnetic field sensor is positioned in the electronic module shaft at a location wherein:
the first magnetic field sensor is responsive to the first magnet during at least part of the insertion path of the electronic module shaft portion into the mechanical lock module;
the first magnetic field sensor is not responsive to the first magnet when the electronic module shaft portion is positioned for secure retention by the mechanical lock module lock mechanism;
the second magnetic field sensor is positioned in the electronic module shaft in a location wherein the second magnetic field sensor is responsive to the first magnet when the electronic module shaft portion is positioned for secure retention by the mechanical lock module lock mechanism;
the electronic module comprises a processing component and a wireless communication component;
the processing component is responsive to the first magnetic field sensor and the second magnetic field sensor;
the processing component is configured for generating magnetic field alarm information if the processing component detects an unexpected magnetic field sensor reading for a securely-retained electronic module shaft portion wherein the unexpected magnetic field sensor reading is selected from the group of:
first magnetic field sensor and the second magnetic field sensor simultaneously detect a magnetic field; and
the first magnetic field sensor and the second magnetic field sensor simultaneously detect the absence of a magnetic field; and
the wireless communication component is configured for wirelessly transmitting the magnetic field alarm information.

2. The locking system of claim 1 wherein:
the locking system is a locking system for a moveable freight container;
the electronic module shaft comprises a non-magnetic material;
the electronic module shaft comprises a straight stainless-steel cylinder;
the electronic module shaft comprises a hollow core;
the first magnetic field sensor is located in the electronic module shaft hollow core;
the second magnetic field sensor is located in the electronic module shaft hollow core;
the mechanical lock mechanism comprises a lock cylinder and a plurality of lock pins;
mechanical movement from an unlocked position to a locked position comprises the rotation of a mechanical key in the lock cylinder;
the electronic module shaft portion retaining feature comprises a circular groove in the electronic module shaft cylinder;
the mechanical lock module further comprises a second magnet;
the mechanical lock module further comprises a third magnet;
the electronic module further comprises a third magnetic field sensor;
the electronic module further comprises a fourth magnetic field sensor;
the first magnetic field sensor, second magnetic field sensor, third magnetic field sensor, and fourth magnetic field sensor comprise sensors selected from the group of:
  a reed switch;
  a Hall effect sensor; and a
  a magnetoresistance sensor;
the first magnetic field sensor is responsive to the position of the electronic module shaft portion and the first magnet, the second magnet, and the third magnet;
the second magnetic field sensor is responsive to the position of the electronic module shaft portion, the second magnet, and the third magnet;
the third magnetic field sensor is responsive to the position of the electronic module shaft portion and the third magnet;
the fourth magnetic field sensor is responsive to the position of the electronic module shaft position and the third magnet;
the electronic module comprises a rechargeable battery, a non-rechargeable high capacity battery, and a low-impedance switching circuit wherein the low-impedance switching circuit is configured to select whether electrical power for the electronic module is received from a source selected from the group of the rechargeable battery and the non-rechargeable high capacity battery;
the electronic module processing component comprises a first processor configured for low power consumption and continuous operation when the locking system is in use;
the electronic module processing component comprises a second processor configured:
  to be awoken by the first processor when the locking system needs greater computational throughput than is available from the first processor; and
  to sleep when the second processor not needed;
the electronic module comprises an inertial measurement component for determining inertial information wherein:
  the inertial measurement component further comprises a 3-axis accelerometer, a 3-axis gyroscope, and a 3-axis magnetometer; and
  the determination of inertial information comprises the use of a fusion filter wherein:
  the fusion filter is selected from the group of a Kalman filter, a Madgwick filter, and a Mahony filter; and
  the fusion filter calculation comprises the use of a plurality of digital quaternions;
the wireless communication component is configured for wirelessly transmitting the inertial information;
the electronic module is configured for determining geographic position information wherein the geographic position information comprises the geographic position of the locking system at a current time;
the electronic module comprises a first positioning component wherein the first positioning component is responsive to information received from a plurality of global navigation system satellite transmitters;
the electronic module comprises a second positioning component wherein the second positioning component is responsive to:
  information of the geographic position of the locking system at a previous time; and
  inertial information from the inertial measurement component;
the locking system geographic information is responsive to the first positioning component if current information is available from the first positioning component;
the locking system geographic information is responsive to the second positioning component if current information is not available from the first positioning component;
the wireless communication component is configured for wirelessly transmitting the locking system geographic position;
the electronic module comprises an environmental measurement component for determining environmental information wherein:
  the environmental measurement component comprises a temperature sensor, a humidity sensor; and a shock sensor;
  the shock sensor is configured for sensing accelerations up to 500 times the acceleration of gravity; and
  the environmental information comprises temperature information, humidity information, and shock information;
the wireless communication component is configured for wirelessly transmitting the environmental information;
the electronic module comprises a tampering component configured for generating tampering alarm information in response to a tampering detector configured for identifying whether an attempt is made to open the electronic module;
the wireless communication component is configured for wirelessly transmitting the tampering alarm information;
the electronic module comprises a non-volatile electronic memory configured for storing the magnetic field alarm, the inertial information, the geographic position information, the environmental information, and the tampering alarm information;
the wireless communication component comprises a first cellular wireless communications system transmitter comprising a first subscriber identity module wherein the first wireless communication transmitter is configured for sending the magnetic field alarm information, the inertial information, the geographic position information, the environmental information and the tampering alarm information using a cellular communications frequency and cellular communications protocol; and the wireless communication component comprises a second cellular wireless communication system transmitter comprising a second subscriber identity module wherein the second wireless communication transmitter is configured for sending the magnetic field alarm information, the inertial information, the geographic position information, the environmental information and the tampering alarm information using a cellular communications frequency and cellular communications protocol when the first wireless communication system transmitter is unable to transmit data;

the wireless communication component further comprises a wireless mesh network communication element wherein the wireless mech network communication element is configured for transmitting the magnetic field alarm information, the inertial information, the geographic position information, the environmental information, and the tampering alarm information with a plurality of other locking systems and vehicle tail lights using a wireless communication protocol selected from the group of WiFi, Zigbee and Xbee; and the system comprises a database connected to the internet wherein the database is configured to receive and store the magnetic field alarm information, the inertial information, the geographic position information, the environmental information and the tampering alarm information from the wireless communication component.

3. The locking system of claim 1 wherein:

the first magnetic field sensor comprises a Reed switch configured to close a first electrical circuit in the presence of a magnetic field and open the first electrical circuit in the absence of a magnetic field; and the second magnetic field sensor comprises a Reed switch configured to close a second electrical circuit in the presence of a magnetic field and open the second electrical circuit in the absence of a magnetic field.

4. The locking system of claim 1 wherein:

the first magnetic field sensor comprises an analog magnetic field sensor configured to generate a first analog electrical signal in response to magnetic field strength in the region of the first magnetic field sensor; and the second magnetic field sensor comprises an analog magnetic field sensor configured to generate a second analog electrical signal in response to magnetic field strength in the region of the second magnetic field sensor.

5. The locking system of claim 4 wherein:

the first magnetic field sensor comprises a Hall effect sensor: and the second magnetic field sensor comprises a Hall effect sensor.

6. The locking system of claim 4 wherein:

the first magnetic field sensor comprises a magnetoresistive sensor: and the second magnetic field sensor comprises a magnetoresistive sensor.

7. The locking system of claim 1 wherein:

the locking system is a locking system for a moveable freight container;

the electronic module shaft comprises a non-magnetic material;

the electronic module shaft comprises a straight stainless-steel cylinder;

the electronic module shaft comprises a hollow core;

the mechanical lock mechanism comprises a lock cylinder and a plurality of lock pins;

mechanical movement from an unlocked position to a locked position comprises the rotation of a mechanical key in the lock cylinder;

the first magnetic field sensor and the second magnetic field sensor comprise magnetic field sensors selected from the group of:

a reed switch;

a Hall effect sensor; and a a magnetoresistance sensor;

the electronic module is configured for determining geographic position information wherein the geographic position information comprises the geographic position of the locking system at a current time;

the electronic module comprises a first positioning component wherein the first positioning component is responsive to information received from a plurality of global navigation system satellite transmitters;

the locking system geographic information is responsive to the first positioning component; and the wireless communication component comprises a first cellular wireless communications system transmitter comprising a first subscriber identity module wherein the first wireless communication transmitter is configured for sending the magnetic field alarm information, the inertial information, the geographic position information, the environmental information and the tampering alarm information using a cellular communications frequency and cellular communications protocol.

8. The locking system of claim 1 wherein:

the locking system is a locking system for a moveable freight container;

the electronic module comprises an inertial measurement component for determining inertial information wherein:

the inertial measurement component further comprises a 3-axis accelerometer, a 3-axis gyroscope, and a 3-axis magnetometer; and the determination of inertial information comprises the use of a fusion filter wherein:

the fusion filter is selected from the group of a Kalman filter, a Madgwick filter, and a Mahony filter; and the fusion filter calculation comprises the use of a plurality of digital quaternions.

9. The locking system of claim 1 wherein:

the locking system is a locking system for a moveable freight container;

the electronic module comprises an inertial measurement component for determining inertial information wherein:

the inertial measurement component further comprises a 3-axis accelerometer, a 3-axis gyroscope, and a 3-axis magnetometer; and the determination of inertial information comprises the use of a fusion filter;

the electronic module is configured for determining geographic position information wherein the geographic position information comprises the geographic position of the locking system at a current time;

the electronic module comprises a first positioning component wherein the first positioning component is responsive to information received from a plurality of global navigation system satellite transmitters;
the electronic module comprises a second positioning component wherein the second positioning component is responsive to:
  information of the geographic position of the locking system at a previous time; and
  inertial information from the inertial measurement component;
the locking system geographic information is responsive to the first positioning component if current information is available from the first positioning component;
the locking system geographic information is responsive to the second positioning component if current information is not available from the first positioning component; and
the wireless communication component is configured for wirelessly transmitting the locking system geographic position.

10. The locking system of claim 1 wherein:
the locking system is a locking system for a moveable freight container;
the wireless communication component comprises a first cellular wireless communications system transmitter comprising a first subscriber identity module wherein the first wireless communication transmitter is configured for sending the magnetic field alarm information using a cellular communications frequency and cellular communications protocol; and
the wireless communication component comprises a second cellular wireless communication system transmitter comprising a second subscriber identity module wherein the second wireless communication transmitter is configured for sending the magnetic field alarm information if the first wireless communication system transmitter is unable to transmit data.

11. The locking system of claim 1 wherein:
the locking system is a locking system for a moveable freight container;
the mechanical lock module further comprises a second magnet;
the mechanical lock module further comprises a third magnet;
the electronic module further comprises a third magnetic field sensor;
the electronic module further comprises a fourth magnetic field sensor;
the first magnetic field sensor, second magnetic field sensor, third magnetic field sensor, and fourth magnetic field sensor comprise analog magnetic sensors;
the first magnetic field sensor is responsive to the position of the electronic module shaft portion and the first magnet, the second magnet, and the third magnet;
the second magnetic field sensor is responsive to the position of the electronic module shaft portion, the second magnet, and the third magnet;
the third magnetic field sensor is responsive to the position of the electronic module shaft portion and the third magnet; and
the fourth magnetic field sensor is responsive to the position of the electronic module shaft position and the third magnet.

12. The locking system of claim 1 wherein:
the locking system is a locking system further comprises a moveable freight container;
the electronic module shaft comprises a straight stainless-steel cylinder;
the electronic module shaft comprises a hollow core;
the mechanical lock mechanism comprises a lock cylinder and a plurality of lock pins; and
mechanical movement from an unlocked position to a locked position comprises the rotation of a mechanical key in the lock cylinder.

13. The locking system of claim 1 wherein:
the locking system is a locking system for a moveable freight container;
the electronic module shaft comprises a non-magnetic material;
the electronic module shaft comprises a straight stainless-steel cylinder;
the electronic module shaft comprises a hollow core;
the electronic module processing component comprises a first processor configured for low power consumption and continuous operation when the locking system is in use;
the electronic module processing component comprises a second processor configured:
  to be awoken by the first processor when the locking system needs greater computational throughput than is available from the first processor; and
  to sleep when the second processor not needed;
the electronic module comprises an environmental measurement component for determining environmental information wherein:
  the environmental measurement component comprises a temperature sensor, a humidity sensor; and a shock sensor;
  the shock sensor is configured for sensing accelerations up to 500 times the acceleration of gravity; and
  the environmental information comprises temperature information, humidity information, and shock information;
the wireless communication component is configured for wirelessly transmitting the environmental information;
the electronic module comprises a tampering component configured for generating tampering alarm information in response to a tampering detector configured for identifying whether an attempt is made to open the electronic module; and
the wireless communication component is configured for wirelessly transmitting the tampering alarm information.

14. The locking system of claim 1 wherein:
the locking system is a locking system for a moveable freight container;
the wireless communication component further comprises a wireless mesh network communication element wherein the wireless mech network communication element is configured for transmitting the magnetic field alarm information, the inertial information, the geographic position information, the environmental information, and the tampering alarm information with a plurality of other locking systems and vehicle tail lights using a wireless communication protocol selected from the group of WiFi, Zigbee and Xbee; and
the system comprises a database connected to the internet wherein the database is configured to receive and store the magnetic field alarm information, the inertial information, the geographic position information, the environmental information and the tampering alarm information from the wireless communication component.

15. A lock wherein:

the lock comprises an electronic module and a mechanical module;
the mechanical module comprises a cavity;
the electronic module comprises a shaft wherein least a portion of the shaft is configured for insertion into the mechanical module cavity;
the mechanical module comprises a lock mechanism configured for mechanical movement from an unlocked position to a locked position;
the shaft portion comprises a retaining feature configured for secure retention of the shaft by the mechanical lock module when the shaft portion is inserted into the mechanical lock module cavity and the mechanical lock module lock mechanism is in a locked position;
the mechanical module comprises a first magnet;
the electronic module comprises a first magnetic sensor and a second magnetic sensor;
the first sensor is positioned in the shaft at a location wherein:
  the first sensor is responsive to the first magnet for at least part of the insertion path of the shaft portion into the cavity;
  the first sensor is not responsive to the first magnet when the shaft portion is positioned for secure retention by the lock mechanism;
the second field sensor is positioned in the shaft in a location wherein the second sensor is responsive to the first magnet when the shaft portion is positioned for secure retention by the lock mechanism;
the electronic module comprises a processing component and a wireless communication component;
the processing component is configured for generating magnetic field alarm information if the processing component detects an unexpected interruption in a signal selected from the group of a first magnetic sensor signal and a second magnetic sensor signal; and
the wireless communication component is configured for wirelessly transmitting the magnetic field alarm information.

16. The lock of claim 15 wherein:
the lock is attached to a moveable freight container;
the shaft comprises a non-magnetic material;
the shaft comprises a straight stainless-steel cylinder;
the shaft comprises a hollow core;
the retaining feature comprises a circular groove in the shaft cylinder;
the lock mechanism comprises a lock cylinder and a plurality of lock pins;
mechanical movement from an unlocked position to a locked position comprises the rotation of a mechanical key in the lock cylinder;
the wireless communication component comprises a cellular wireless communications system transmitter and receiver;
the electronic module is configured for determining geographic position information wherein the geographic position information comprises the geographic position of the lock at a current time;
the geographic position information is responsive to:
  information received from a plurality of global navigation system satellite transmitters;
  information received from a cellular communications tower;
  information of the geographic position of the lock at a previous time; and
  inertial information; and
the wireless communication component is configured for wirelessly transmitting the geographic position of the lock.

17. The lock of claim 15 wherein:
the electronic module comprises an inertial measurement component for determining inertial information wherein the inertial measurement component computes the inertial information using a plurality of digital quaternions.

18. The lock of claim 15 wherein:
the wireless communication component comprises a wireless mesh network communication element wherein the wireless mech network communication element is configured for exchanging data with a transmitter located in a vehicle tail light.

19. The lock of claim 15 wherein:
the electronic module comprises a rechargeable battery, a non-rechargeable high capacity battery, and a low-impedance switching circuit wherein the low-impedance switching circuit is configured to select whether electrical power for the electronic module is received from a source selected from the group of the rechargeable battery and the non-rechargeable high capacity battery;
the processing component comprises a first processor configured for low power consumption and continuous operation when the locking system is in use; and
the processing component comprises a second processor configured:
  to be awoken by the first processor when the locking system needs greater computational throughput than is available from the first processor; and
  to sleep when the second processor not needed.

20. A locking method comprising the steps of:
establishing an electronic module wherein the electronic module comprises:
  a shaft further comprising:
    a retaining feature;
    a first magnetic sensor located inside the shaft; and
    a second magnetic sensor located inside the shaft;
  an electronic processing component; and
  a wireless communication component;
establishing a mechanical module wherein the mechanical module comprises:
  a cavity;
  a lock mechanism; and
  a magnet
inserting at least a portion of the shaft into the cavity;
determining that the shaft portion is partially inserted into the mechanical module cavity by using the first sensor to detect a magnetic field from the magnet, wherein determining partial insertion comprises using the electronic processing component;
determining that the shaft portion is fully inserted into the cavity by:
  using the second sensor to detect a magnetic field from the magnet;
  using the first sensor to determine that there is no magnetic field in the region of the first sensor; and
  using the electronic processing component to process the magnetic field information received from the first sensor and the second sensor;
rotating the lock mechanism from an unlocked position to a locked position after the shaft portion is fully inserted into the cavity;
securely retaining the shaft portion in the cavity by having the lock mechanism engage with the retaining feature;

using the electronic processing component to generate a magnetic field alarm signal if the first magnetic sensor and the second magnetic sensor simultaneously detect a condition selected from the group of:
  both sensors detect a magnetic field; and
  both sensors detect the absence of a magnetic field; and
using the wireless communication component to wirelessly transit the magnetic field alarm signal.

* * * * *